(12) United States Patent
Jain

(10) Patent No.: US 9,153,594 B2
(45) Date of Patent: Oct. 6, 2015

(54) NONVOLATILE MEMORY AND THREE-STATE FETS USING CLADDED QUANTUM DOT GATE STRUCTURE

(76) Inventor: Faquir C. Jain, Storrs, CT (US)

(*) Notice: Subject to any disclaimer, the term of this patent is extended or adjusted under 35 U.S.C. 154(b) by 1075 days.

(21) Appl. No.: 12/077,453

(22) Filed: Mar. 20, 2008

(65) Prior Publication Data

US 2009/0173934 A1  Jul. 9, 2009

Related U.S. Application Data

(63) Continuation-in-part of application No. 12/006,974, filed on Jan. 9, 2008.

(51) Int. Cl.

| | |
|---|---|
| H01L 29/06 | (2006.01) |
| H01L 27/115 | (2006.01) |
| G11C 11/56 | (2006.01) |
| H01L 21/28 | (2006.01) |
| H01L 27/11 | (2006.01) |
| H01L 29/10 | (2006.01) |
| H01L 29/423 | (2006.01) |
| H01L 29/66 | (2006.01) |
| H01L 29/778 | (2006.01) |
| G11C 11/412 | (2006.01) |

(52) U.S. Cl.
CPC .......... *H01L 27/11521* (2013.01); *G11C 11/56* (2013.01); *H01L 21/28273* (2013.01); *H01L 27/1104* (2013.01); *H01L 29/1054* (2013.01); *H01L 29/42332* (2013.01); *H01L 29/42348* (2013.01); *H01L 29/66825* (2013.01); *H01L 29/7782* (2013.01); *H01L 29/7783* (2013.01); *G11C 11/412* (2013.01); *H01L 21/28282* (2013.01); *H01L 29/66833* (2013.01)

(58) Field of Classification Search
USPC .................. 257/315, 317, 321, 325, E29.129, 257/E29.134, E29.309, E29.304, E29.316, 257/19, 20
See application file for complete search history.

(56) References Cited

U.S. PATENT DOCUMENTS

| | | | | |
|---|---|---|---|---|
| 5,937,295 | A * | 8/1999 | Chen et al. | 438/257 |
| 6,946,346 | B2 * | 9/2005 | Chae et al. | 438/257 |
| 6,969,875 | B2 * | 11/2005 | Fitzgerald | 257/192 |
| 7,402,505 | B1 * | 7/2008 | Krivokapic | 438/486 |
| 2002/0017644 | A1 * | 2/2002 | Fitzgerald | 257/69 |
| 2002/0030203 | A1 * | 3/2002 | Fitzgerald | 257/194 |
| 2003/0132432 | A1 * | 7/2003 | Yoshii et al. | 257/17 |
| 2004/0155283 | A1 * | 8/2004 | Yoo et al. | 257/315 |

(Continued)

*Primary Examiner* — Vongsavanh Sengdara
(74) *Attorney, Agent, or Firm* — Hong Lin; Steven M. McHugh

(57) ABSTRACT

The present invention discloses use of quantum dot gate FETs as a nonvolatile memory element that can be used in flash memory architecture as well as in a nonvolatile random access memory (NVRAM) configuration that does not require refreshing of data as in dynamic random access memories. Another innovation is the design of quantum dot gate nonvolatile memory and 3-state devices using modulation doped field-effect transistors (MODFETs), particularly MOS-gate field effect transistors. The cladded quantum dot gate MODFETs can be designed in Si—SiGe, InGaAs—InP and other material systems. The incorporation of 3-state FET devices in static random access memory (SRAM) cell is described to result in advanced multi-state memory operation. Unlike conventional SRAMs, the 3-state QD-FET based of SRAMs provides 3 and 4-state memory operation due to the utilization of the intermediate states particularly in CMOS configuration. QD-gate FETs, potentially suitable for 8 nm channel lengths, in vertical configuration (VFET) are also described.

10 Claims, 17 Drawing Sheets n-channel QD gate FET in which SiOx-Si dots are assembled using SSA.

(56) References Cited

U.S. PATENT DOCUMENTS

| | | | |
|---|---|---|---|
| 2004/0256614 A1* | 12/2004 | Ouyang et al. | 257/20 |
| 2005/0247924 A1* | 11/2005 | Atwater et al. | 257/13 |
| 2006/0261401 A1* | 11/2006 | Bhattacharyya | 257/316 |
| 2008/0169501 A1* | 7/2008 | Yang et al. | 257/321 |

* cited by examiner

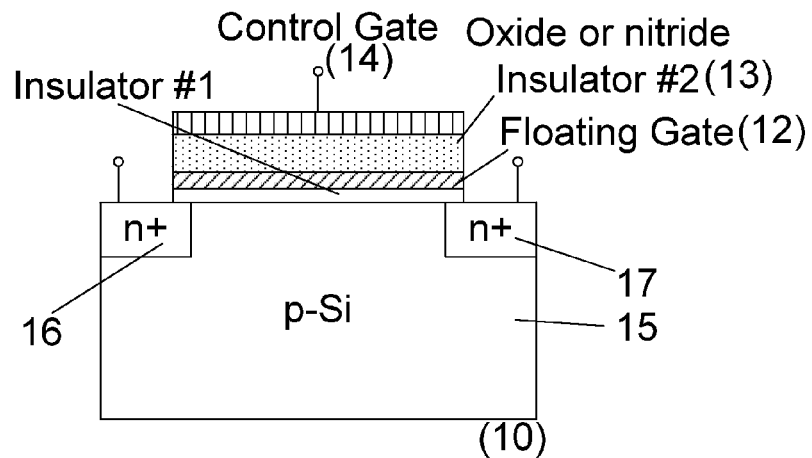
Fig. 1(a). Field Effect Transistor (10) configured as a floating gate memory.
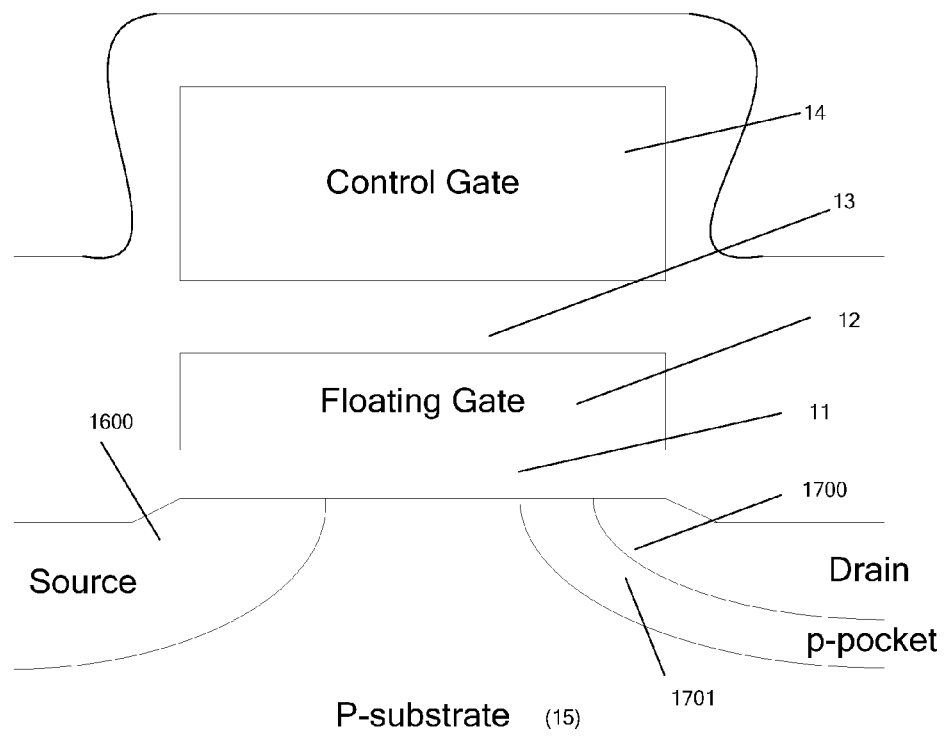
Fig. 1(b) Floating gate memory cell with asymmetric source/drain, and drain side with a p-type halo or pocket doping.

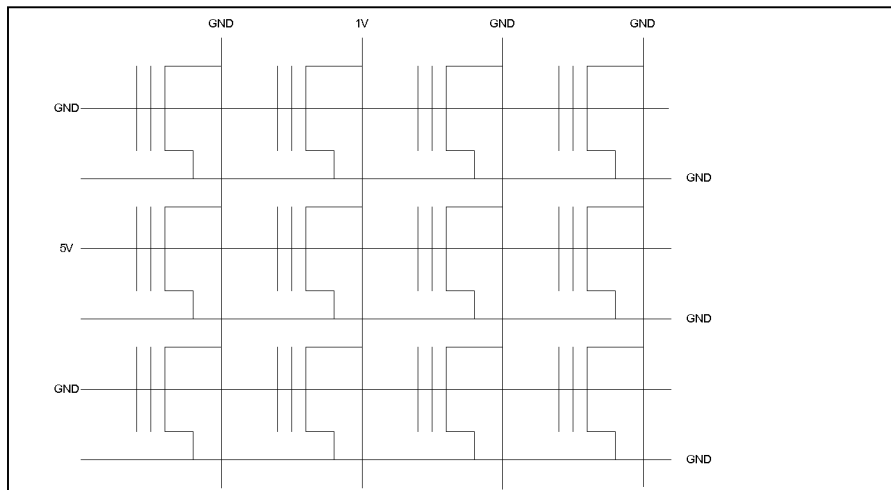
Fig. 1(c-1). Read operation voltages in a NOR cell.
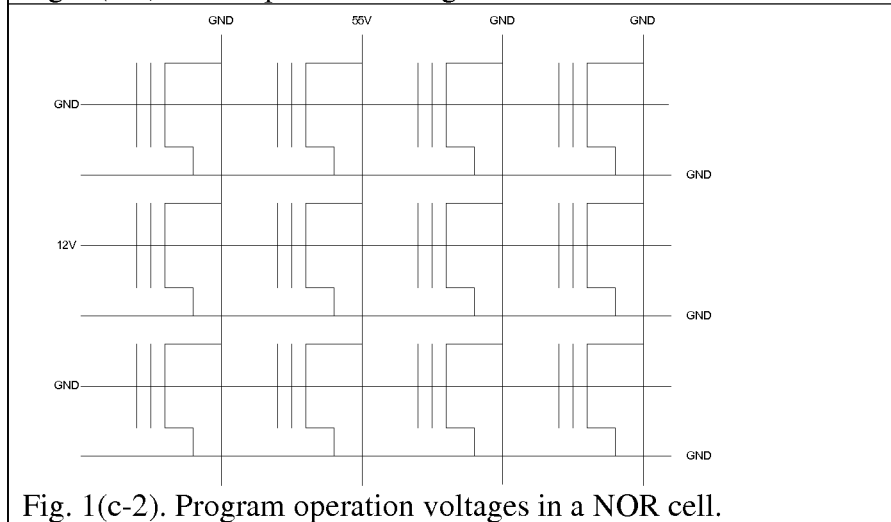
Fig. 1(c-2). Program operation voltages in a NOR cell.
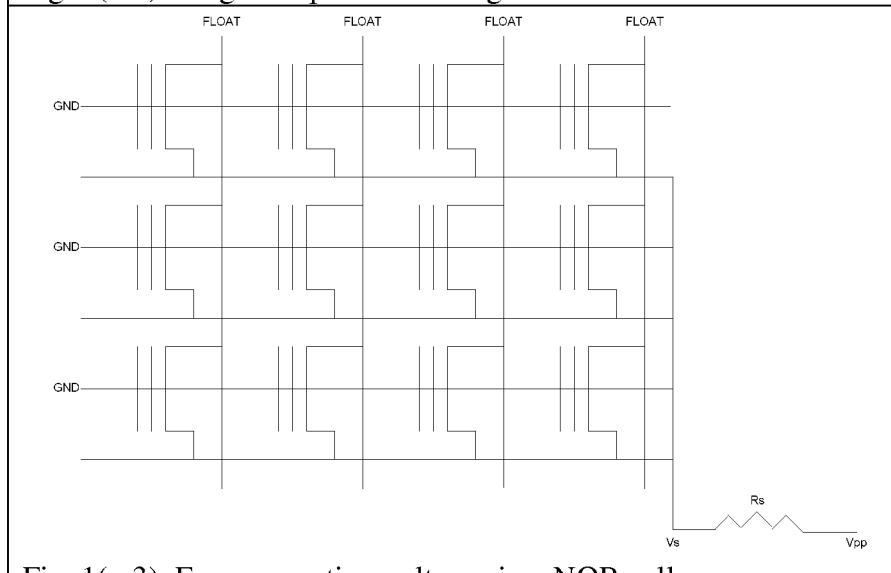
Fig. 1(c-3). Erase operation voltages in a NOR cell.

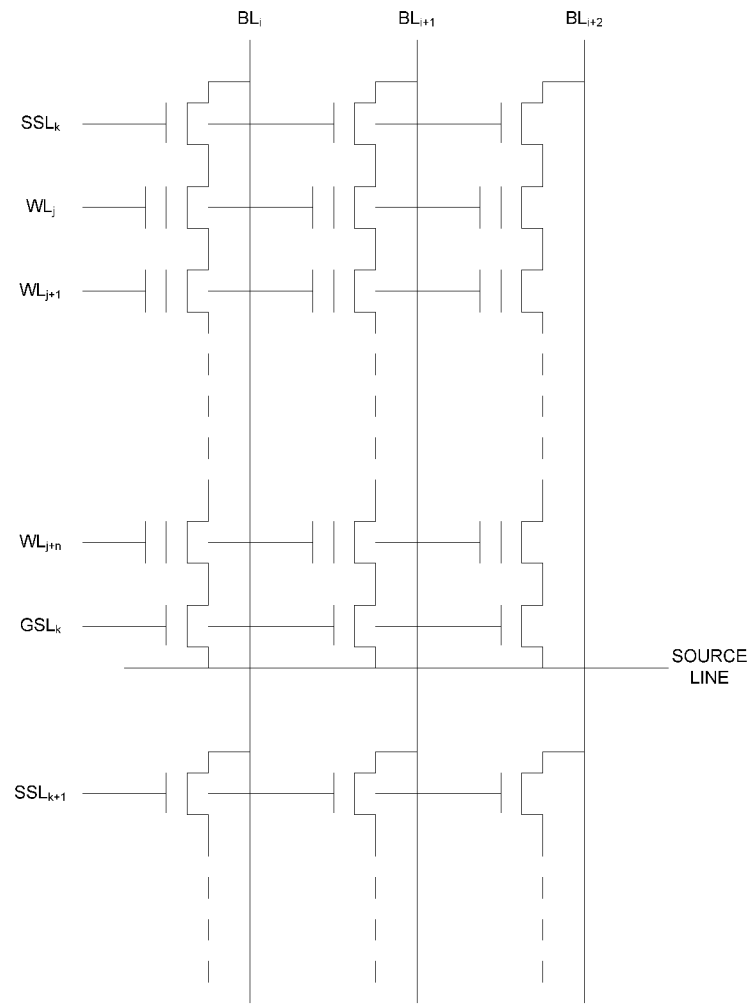
Fig. 1(d) NAND architecture for nonvolatile memory.

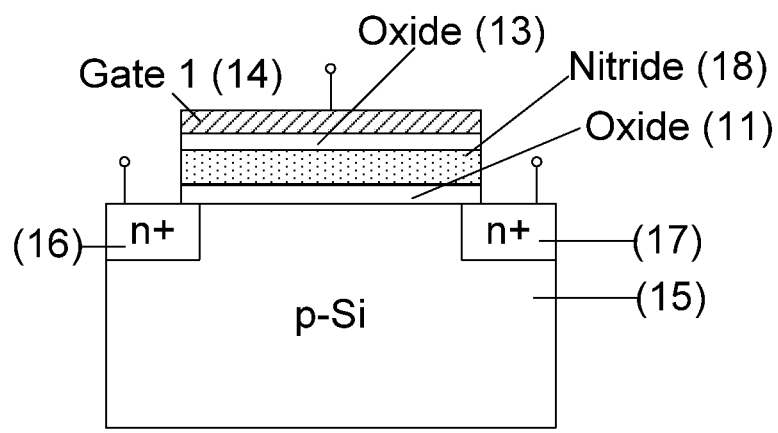
Fig .2 Floating trap memory.

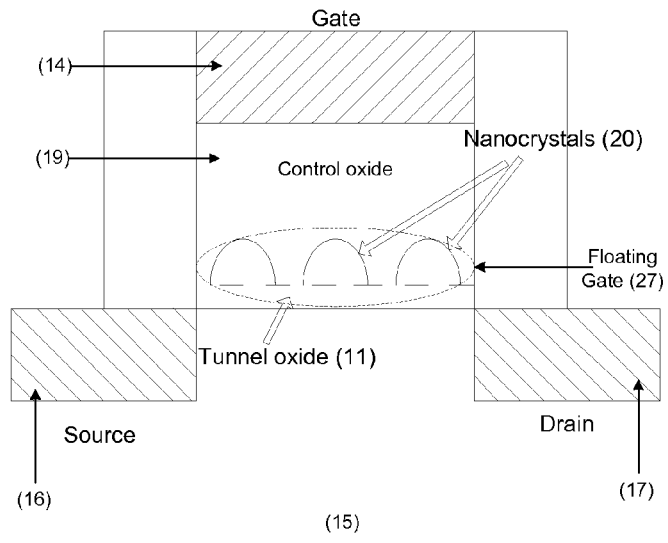
Fig. 3(a). Schematic of a conventional nanocrystal quantum dot gate memory (Tiwari et al.)
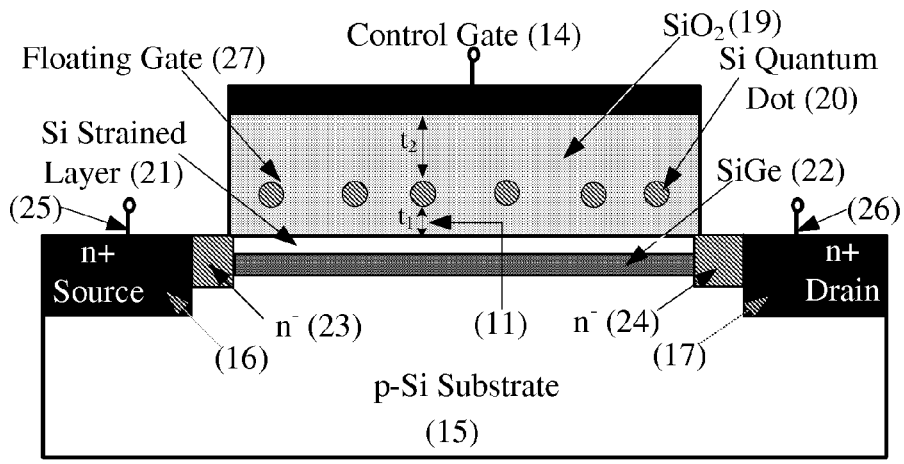
Fig. 3(b). Schematic of a conventional nanocrystal quantum dot gate memory (with strained Si transport channel).

n-channel QD gate FET in which SiOx-Si dots are assembled using SSA.

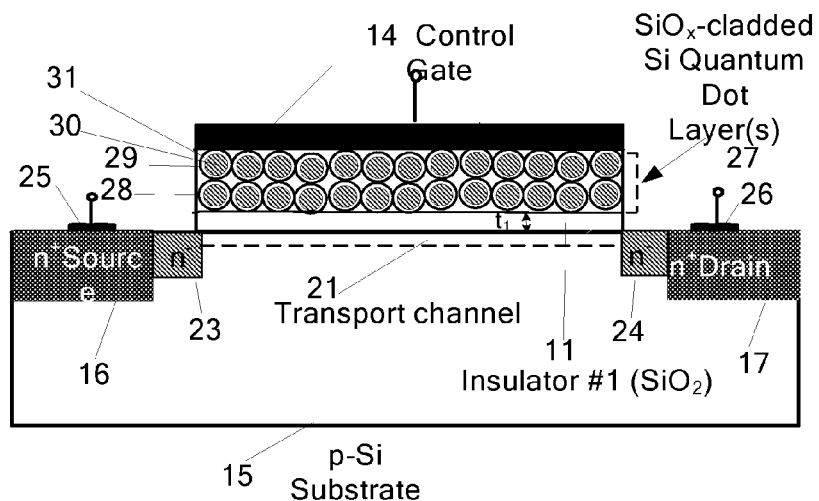
Fig. 7a Long channel FET with two-layers of $SiO_x$-Si quantum dots.
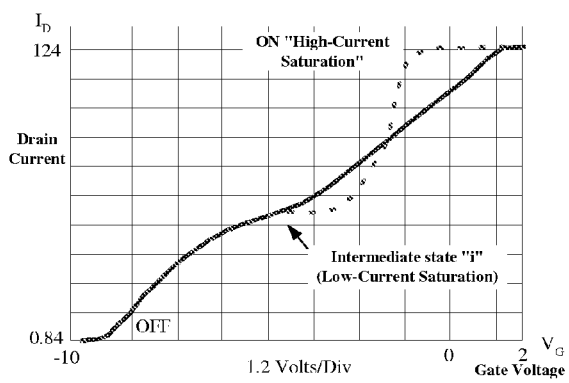
Fig. 7(b) 3-stats in $I_D$-$V_G$ characteristic of a *long-channel* FET (solid line experimental) and expected behavior with design changes (red dashed line).

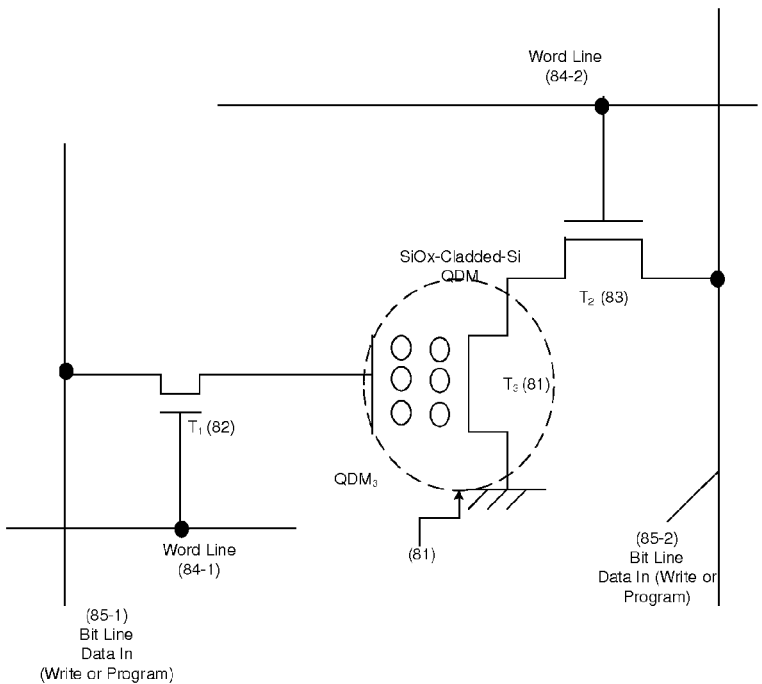
Fig. 8a. Three-transistor nonvolatile RAM (NVRAM) using QD nonvolatile memory as a storage device.
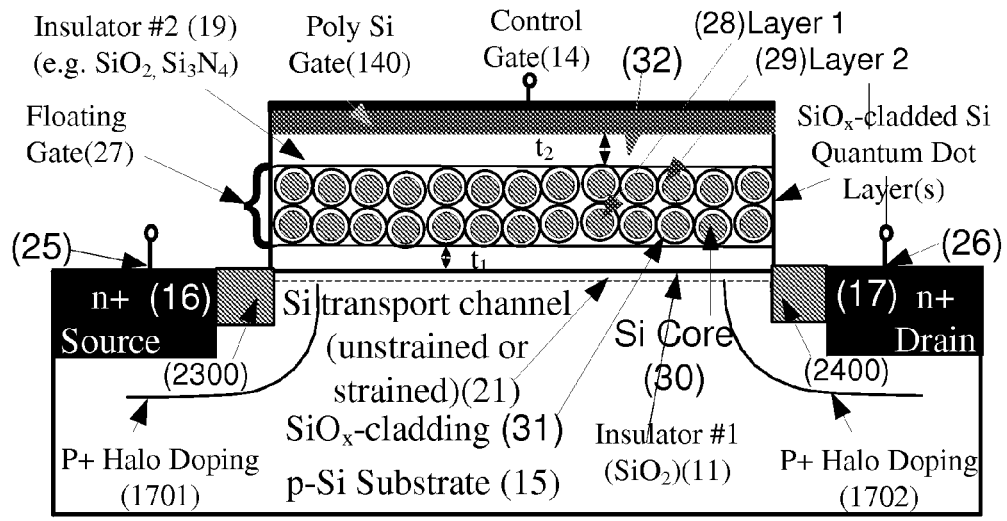
Fig. 8b QD-gate nonvolatile memory device [T3 in Fig. 8a] having asymmetric source and drain extensions and p-type halo doping.

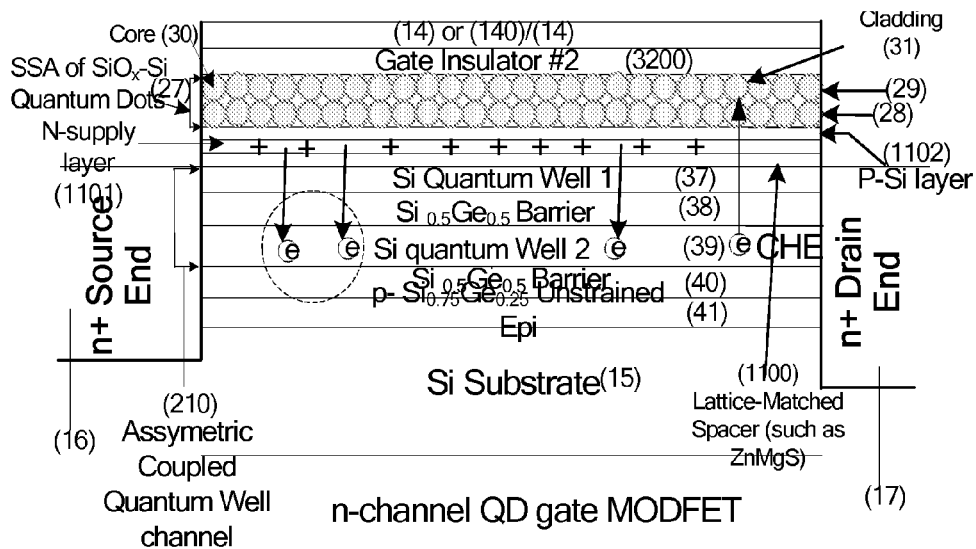
Figure 9a Schematic cross-section of a self-aligned MOS-gate SiGe MODFET incorporating QD-gate to realize a nonvolatile memory structure.
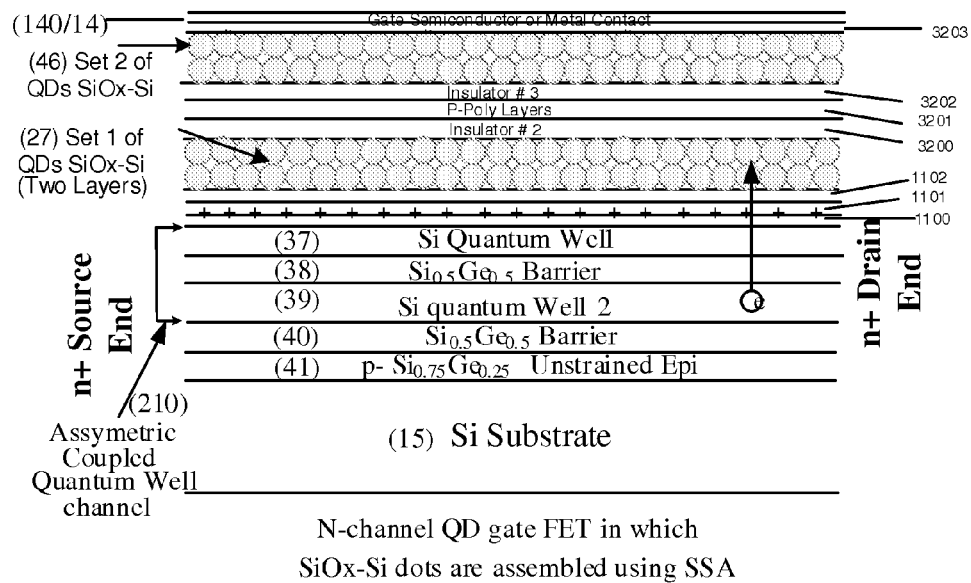
Figure 9b Schematic cross-section of a self-aligned MOS-gate SiGe MODFET incorporating two sets of cladded SiOx-Si QDs for multi-bit operation of a nonvolatile memory structure.

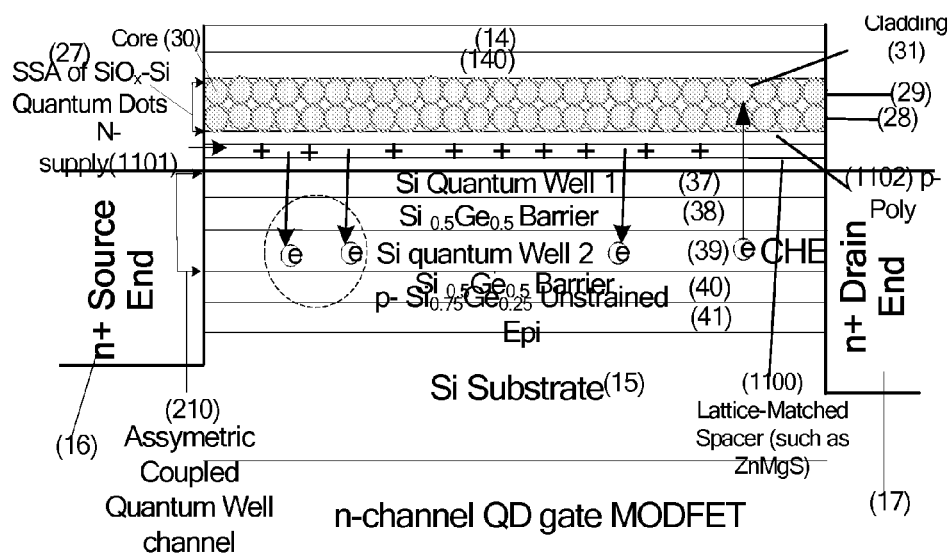
Figure 10 Schematic cross-section of an n-channel self-aligned SiGe MODFET incorporating QD-gate to realize a 3-state bistable FET device.

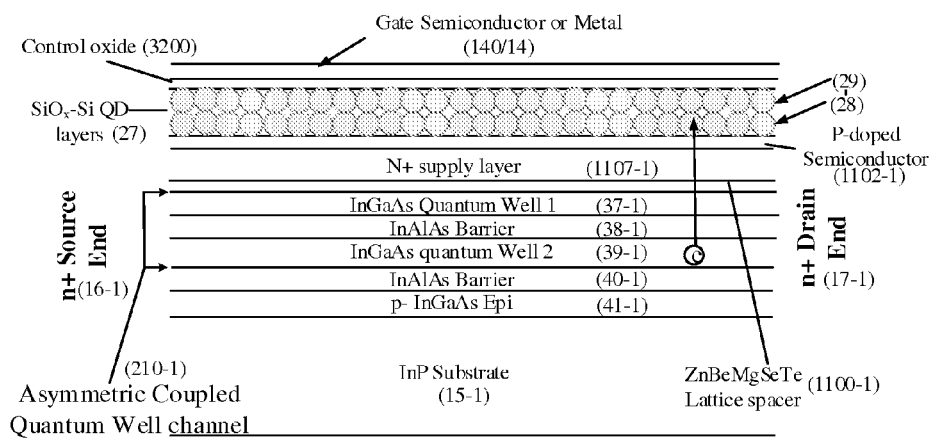
Nonvolatile QD-gate memory using n-channel InGaAs MODFET structure.
Figure 11 Schematic cross-section of a self-aligned InGaAs-InP MODFET incorporating QD-gate to realize a 3-state device.

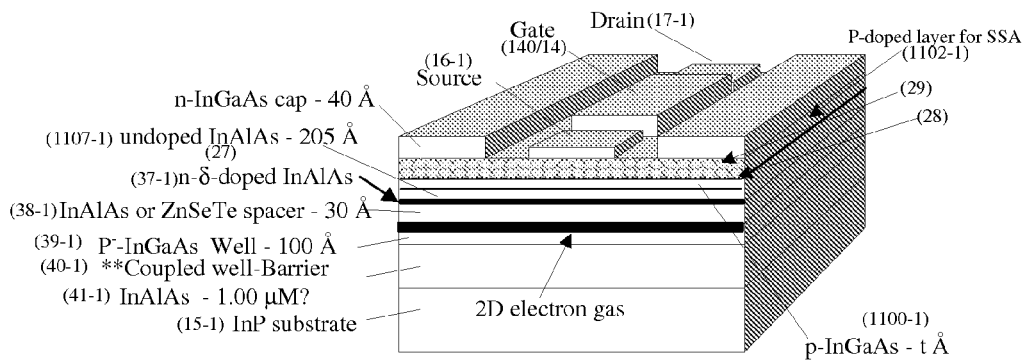
Fig. 12 (a) Three-dimensional view of a 3-state bistable MODFET with QD-Gate;
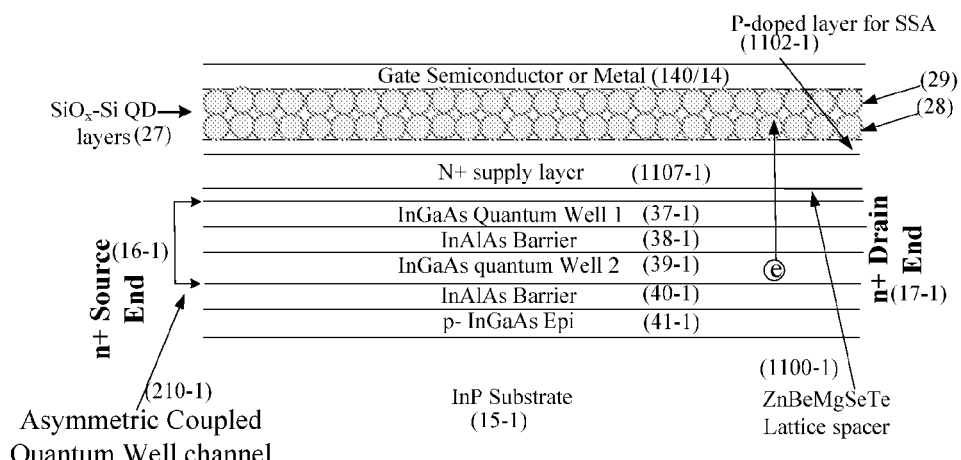
3-state self aligned QD-gate n-channel InGaAs-InP MODFET structure.
Fig. 12b Cross-sectional schematic of a 3-state MODFET with QD-Gate.

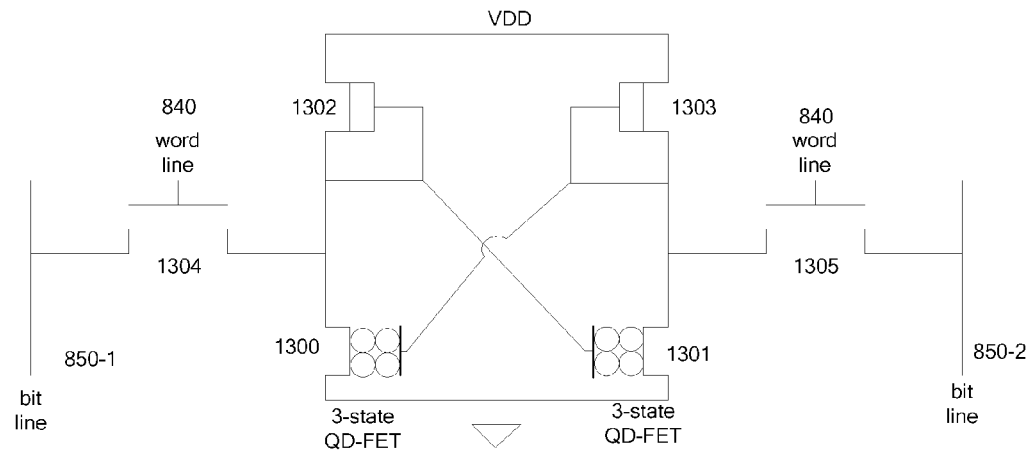
Fig. 13a. N-MOS based static RAM (SRAM) cell with 3-state QD-gate FETs replacing conventional transistors for 3-state memory operation.
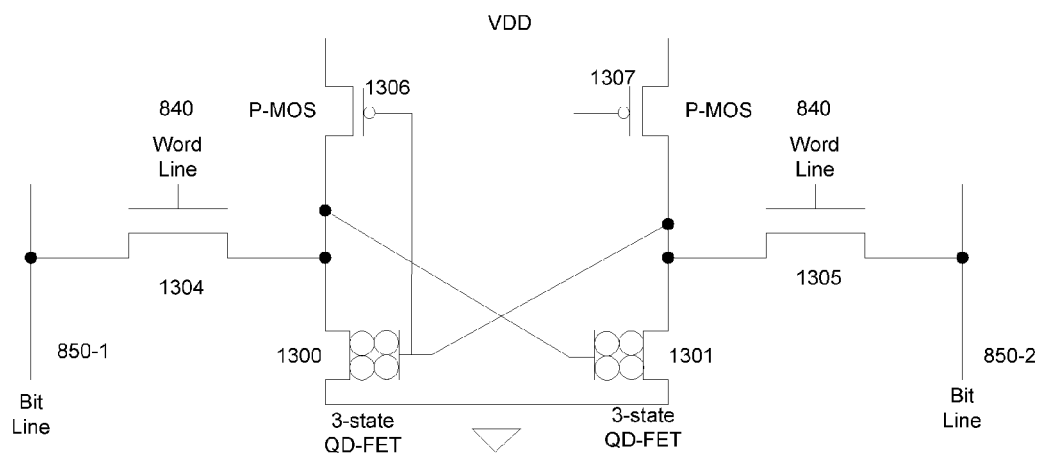
Fig. 13b. CMOS based static RAM (SRAM) cell with 3-state QD-gate FETs replacing conventional transistors for 3-state memory operation.

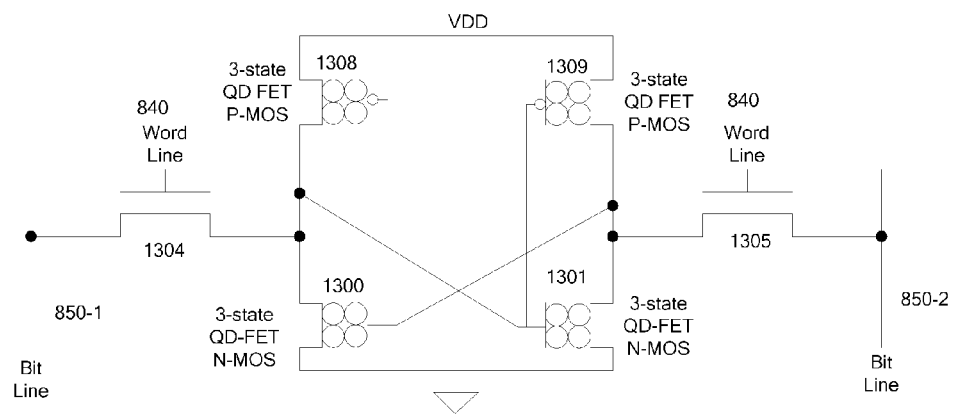
Fig. 13c. CMOS based static RAM (SRAM) cell with 3-state QD-gate nFETs and p-FETs replacing conventional transistors for 4-state memory operation.

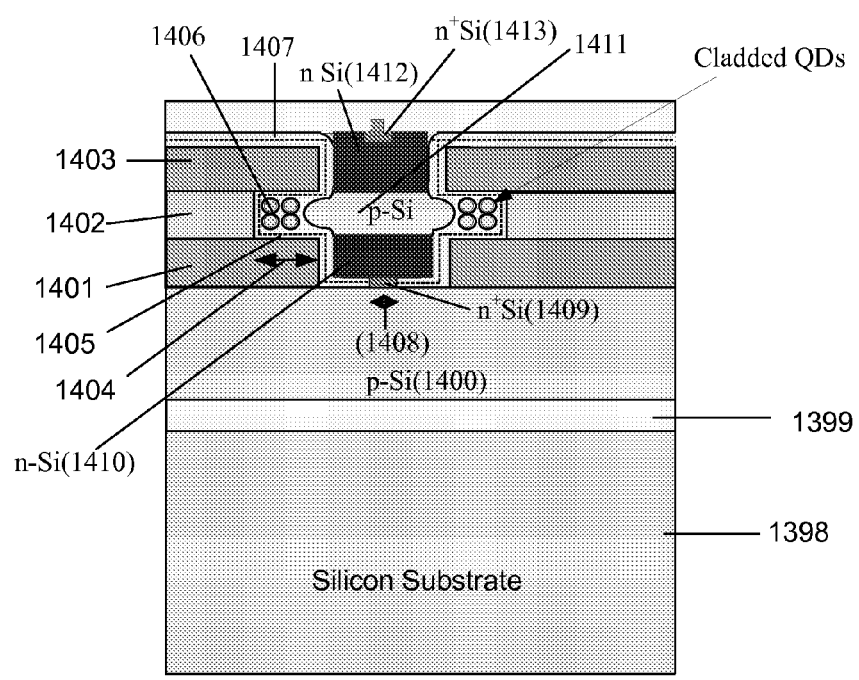
Fig. 14. Vertical FETs configured as nonvolatile QD gate memory and bistable (without insulator layer 1405).

NONVOLATILE MEMORY AND THREE-STATE FETS USING CLADDED QUANTUM DOT GATE STRUCTURE

This application is a Continuation-in-part of application Ser. No. 12/006974, filed Jan. 9, 2008 (pending)

BACKGROUND OF THE INVENTION

1. Field of the Invention

This invention relates to field-effect transistors (FETs), MOS (Metal Oxide Semiconductor) devices, and MOS-gate modulation doped field-effect transistors (MODFETs) in which the gate consists of a layer or layer(s) of cladded nanoparticles or cladded quantum dots. The device structure behaves as fast access nonvolatile memory structure or as a FET exhibiting multiple states (such as three-state) in its drain current-gate voltage characteristics depending on the configuration of the layers in the gate region which consists layers of cladded quantum dots and thin insulating films. In particular, MOS gate quantum dot nonvolatile memory and 3-state devices in MODFET structural configuration are described. MODFET configured as self-aligned MOS gate incorporating QD layers in gate and asymmetric couple well transport channels is one of the embodiments described for fast access nonvolatile memories. This invention also describes basic cells using quantum dot (QD) gate nonvolatile memory devices, in either QD gate FET or QD gate MODFET configuration, functioning as nonvolatile random access memory (RAM) with appropriate access transistors and bit line architecture. The QD gate FET based nonvolatile RAM (NVRAM) will replace a dynamic random access memory (DRAM) without the need of refreshing or maintaining biasing. Using a multi-bit QD gate nonvolatile memory device, a multi-bit NVRAM is envisioned. In addition, various configurations of static RAMs (SRAMs) using 3-state QD gate FETs are described. Use of 3-state n-channel and p-channel QD FETs configured as SRAM cells are shown to result in 3 state or 4-state memory operations.

2. Brief Description of Prior Art

Nonvolatile memories are used to store information in microchips in flash memory and nonvolatile random access memory [NVRAM] configurations [Sharma, 2003]. Floating trap memory [realized as SONOS (Si-Oxide-Nitride-Oxide-Si) structures] and floating gate memories are two generally used configurations for nonvolatile ROM, EEPROM and flash memories [Brown and Brewer (1998) and Cappelletti et al. (1999)]. Another important category is nonvolatile random access memories (RAMs) which are generally realized as dynamic RAMs (DRAMs; these include magnetic RAMs (MRAMs), carbon nanotube based, and ferroelectric RAM devices), and nonvolatile static RAMs (SRAMs) [Sharma, 2003]. In the case of SRAMs, nonvolatile devices are connected in parallel to conventional SRAM cells. More recently carbon nanotube based memories, where the state of carbon nanotube depends on the gate operating conditions, are reported. These memory devices are continually being scaled down to smaller sizes (such as sub 100 nm) with fast access time and smaller operating voltages. FIG. 1(a) and FIG. 1(b) show schematically two floating gate nonvolatile memory with regular and asymmetric source and drain regions. FIG. 1(c-1, to c-3) describes Read, Program or Write, and Erase operation in NOR configuration. FIG. 2(a) and FIG. 2(b) show schematically front and back-gated floating trap SONOS nonvolatile memory structures, respectively. There are many structural and process variations, as well as circuit architectures (such as NOR and NAND) in designing the floating gate and floating trap nonvolatile memories.

Nonvolatile floating gate quantum dot memories (QDMs), shown in FIGS. 3(a) and 3(b), represent another class of nonvolatile memories that are reported in the literature [Tiwari et al (1995, 1996), and Hasaneen et al (2004)]. In quantum dot gate nonvolatile memories, the charge may be discretely localized on the quantum dots if they are separated from each other. Thus, the charge distribution on the floating quantum dots is not continuous like conventional floating gate devices, and is determined by the tunneling of carriers (either directly from channel or via hot carriers from the drain end or source end). FIG. 3(a) shows a quantum dot gate memory first proposed by Tiwari et al.(1995) FIG. 3(b) shows a strained layer Si transport channel which is fabricated on a SiGe layer [Hasannen et al 2004] to obtain desired carrier mobility in the transport channel. Other investigators including Ostraat et al.[2001] have reported floating gate memory structures using Si nanocrystals. Ostraat et al. have summarized the advantages of nanocrystal based charge storage including: 1) reduced punch-through by reducing drain to floating gate coupling, 2) reduction in stress induced leakage currents, and 3) potentially enhanced retention times. However, the conventional QD based nonvolatile memory suffers from small retention time and fluctuations of electrical characteristics. In the current quantum dot gate device processing there is little control over the location of Si nanoparticles in the gate, their sizes, as well as the separation between them. Invariably, these Si nanocrystal dots are not cladded they touch each other. Some reports outlining formation of cladding on self-organized dots is in the literature after the dots are created. Here, they again suffer from the dot size variation problem inherent in conventional fabrication techniques including those employ self-organization.

Jain [2008] in U.S. patent application Ser. No. 12/006,974 has described quantum dot (QD) gate nonvolatile memories (QDMs) and 3-state FETs using cladded quantum dots. Here, cladded quantum dots (with appropriate diameter Si core is cladded with an insulator such as $SiO_x$) are assembled or deposited on the transport channel of a FET forming the floating gate. The cladding maintains a sufficient separation between Si nanodots. Along with a thin tunnel and control gate layers, the structures control the channel to dot tunneling and inter-dot tunneling, thus improving the 'write and read' and the retention time characteristics. In addition, layers of self-assembled $SiO_x$—Si quantum dots provide discrete values of charge at the floating gate that in turn results in multiple values of threshold shifts suitable for multiple-bit 'Program' and 'Read' capability. This patent describes various QD-gate FETs in Si and other substrates (such as GaAs, InP, etc.) for nonvolatile memory and 3-state FET structures. In addition, the use of coupled-quantum well transport channel, which has more than one wells and appropriate number of barrier layers, is presented for improved device performance. FIGS. 4-6 describe some QD-gate nonvolatile memory structures, and FIG. 7 describes a 3-state FET device.

In this invention, we describe a circuit configuration which permits use of QD-gate nonvolatile memories functioning as random access memories (RAMs) where periodic refreshing like DRAMs is not needed. What is also described in this application is the use of QD gate MODFET structures which are potentially faster than conventional QD gate FETs. In particular, MOS-gate Si MODFETs as memory and 3-state FETs are described. Three layers of quantum dots in the gate may result in two intermediate states (overall 4-states) in MODFET devices presented here.

SUMMARY

This invention describes cladded semiconductor quantum dot gate devices, which function as nonvolatile memory structures for flash memory, nonvolatile random access memory (NVRAM), and three-state field-effect transistors depending on the structure of the gate layers hosting cladded quantum dots. In the case of nonvolatile random access memory, a QD gate nonvolatile element is configured using access transistors to serve as memory cell that can be programmed, read, and erased using a modified bit line circuits and architectures. What are also presented are QD gate MODFET structures which are potentially faster than conventional FETs. In particular, QD MOS-gate Si MODFETs as memory and 3-state FETs are described. The NVRAM cell may employ cladded QD gate MOS, cladded QD gate MODFET, and cladded QD MOS-gate MODFET structures.

In the case of a three-state FET with MODFET structure, at least two layers of cladded quantum dots are desired between the transport channel and the gate with appropriate insulator thicknesses permitting charge transfer from lower QD layer to the upper QD layer for the functioning of the device. In an embodiment, the nonvolatile layer consists of two layers of cladded quantum dots with different core and cladding dimensions. No insulator layer may be needed when the top cladded QD layer has thicker $SiO_x$ layer to realize a MOS gate MODFET. In another embodiment, more than two sets of cladded QD layers, separated by insulator and/or semiconductor layers, are also envisioned for the design and implementation of these devices with desired characteristics. Modulation doped gate field-effect transistor (MODFET) structures have been adapted to serve as QD-based nonvolatile memory devices. MODFET configured as MOS-gate incorporating QD layers are desired as they have a self-aligned gate.

BRIEF DESCRIPTION OF FIGURES

FIG. 1(a). shows cross-sectional schematic of a conventional floating gate nonvolatile memory. Here the field-effect transistor (FET) has two gates. The first gate is the floating gate holding the desired charge and the second gate serves as the control gate for the memory.

FIG. 1(b) shows floating gate memory with asymmetric source and drain regions. The drain side is shown with a p-pocket or p-type halo doping to tailor the drain characteristics.

FIG. 1c shows NOR cell architecture. FIG. 1c-1 showing 'Read' operation; FIG. 1c-2 showing he Write operation; and FIG. 1c-3 illustrating the 'Erase' operation.

FIG. 1(d) shows NAND architecture for nonvolatile memory, in accordance with one embodiment of the invention. (Reference is made to (a) P. Cappelletti et al [1999], and (b) W. Brown and J. Brewer[1998] for conventional memory device structures and architectures.

FIG. 2. shows cross-sectional schematic of a conventional floating trap nonvolatile memory. Here the charge in the gate is trapped at the interface between SiON and $SiO_2$.

FIG. 3(a) shows a conventional floating quantum dot gate nonvolatile memory with Si nanocrystals as the floating gate, $SiO_2$ insulator, and the control gate.

FIG. 3(b) shows a nanocrystal floating gate memory with strained layer transport channel using SiGe layers.

FIG. 7a shows a Three-state field-effect transistor comprising of two layers of cladded quantum dots in the gate region.

FIG. 7(b) shows Bistability in $I_D$-$V_G$ characteristic of a long-channel FET (solid line experimental) and expected behavior with design changes (dashed line).

FIG. 8a shows Three-transistor nonvolatile random access memory (NVRAM) using QD-gate nonvolatile device as the charge storage in the floating gate formed by the SiOx-cladded Si quantum dot.

FIG. 8b shows a nonvolatile QD gate memory with asymmetric extensions.

FIG. 9(a) shows. Schematic cross-section of a self-aligned n-channel SiGe MOS gate MODFET incorporating a QD-gate configured as a nonvolatile memory.

FIG. 9b shows the schematic cross-section of an n-channel SiGe MOS gate MODFET incorporating two sets of cladded dots in the QD-gate configured as a nonvolatile memory.

FIG. 10 shows Schematic cross-section of a self-aligned MOS gate SiGe MODFET incorporating QD gate to realize a 3-state bistable device.

FIG. 11 shows schematic cross-section of a self-aligned InGaAs—InP MODFET incorporating QD-gate to realize a bistable device.

FIG. 12(a) shows Three-dimensional view of a 3-state bistable MODFET with QD-Gate.

FIG. 12(b) shows Cross-sectional schematic of a 3-state bistable MODFET with QD-Gate.

FIG. 13(a) shows N-MOS based static random access memory (SRAM) cell with 3-state QD-gate FETs replacing the conventional transistors for 3-state operation.

FIG. 13(b) shows CMOS-based static RAM (SRAM) cell incorporating two 3-state QD-gate n-FETs replacing conventional n-MOS transistors for 3-state memory operation.

FIG. 13(c) shows a CMOS configuration, where a 4-state memory operation is feasible if pMOS transistors are replaced by 3-state QD-pFETs.

FIG. 14 shows a vertical FET configured as a nonvolatile QD gate memory and a bistable device.

DETAILED DESCRIPTION

Figure 4:
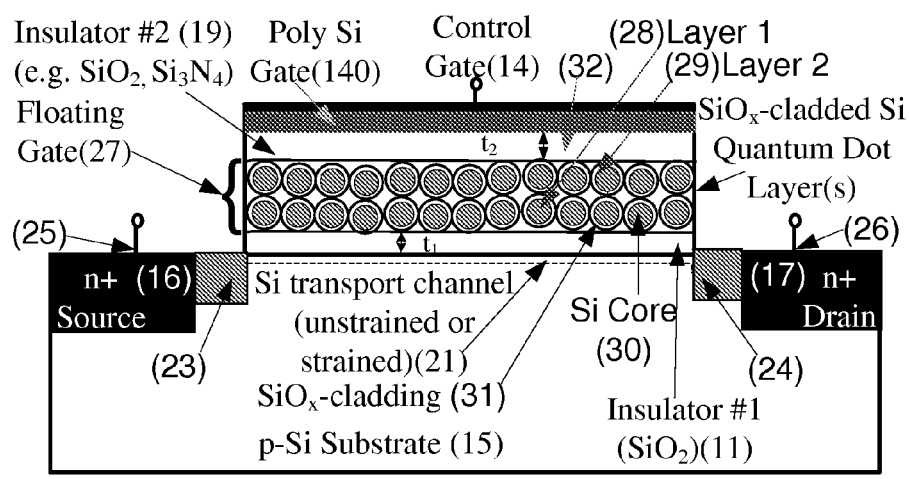
FIG. 4. shows a cross-sectional schematic of a floating gate nonvolatile memory showing details of the cladded quantum dot layers.

FIG. 1(a). shows Cross-sectional schematic of a conventional floating gate nonvolatile memory. Here the Si field-effect transistor (FET) has two gates. The first gate is the floating gate (12), which is deposited on a thin insulator layer (11), and holding the desired charge determining the state of the memory [0 or 1], and the second gate (14) serves as the control gate which is separated by an insulator layer (13) for the memory. The source (16) and drain (17) regions are shown as n+ regions in p-Si substrate (15). The control gate could be simple metal layer (14) or appropriately doped poly-Si layer (not shown here) with the metal contact layer.

FIG. 1(b) shows floating gate memory with asymmetric source (1600) and drain (1700) regions. The drain side is shown with a p-pocket or p-type halo doping (1701) to tailor the drain characteristics of the FET.

FIG. 1(*c*-1 to *c*-3). NOR cell architecture showing 'Read' in FIG. 1*c*-1; Write in FIG. 1*c*-2; and 'Erase' in FIG. 1*c*-3. References are made to (a) P. Cappelletti et al. [1999], and (b) W. Brown and J. Brewer [1998] for conventional memory device structures and architectures. Table I summarizes various voltages during Program/Write, Read and Erase operations.

TABLE I

Voltages during Program/Write, Read and Erase operations.

| Operation | Source voltage $V_S$ | Drain Voltage $V_D$ | Control Gate Voltage $V_G$ |
|---|---|---|---|
| Read | 0 | 1 V | ~5 V |
| Program | 0 | 5 | 12 V (Vpp) |
| Erase (source) | 12 V | Floating | 0 V |
| Erase (negative gate) | 4 V | Floating | −8 V |

During Read operation (see FIG. 1*c*-1), a memory cell is selected by applying a bias to the desired row (word line) while other rows are maintained at 0V (or grounding), and applying 1V to the appropriate bit line (column). The cell status (0 or 1) is determined by comparing the current of the selected cell against a standard reference cell, the outcome is converted into voltage which is the output. In Program operation, the floating gate is charged by trapping electrons obtained using channel hot carrier injection (CHE) and/or tunneling from the inversion channel. This shifts the threshold voltage of the FET/cell. As shown in FIG. 1*c*-2, the control gate of a selected memory cell is connected to a much higher voltage (12V). This high voltage can be generated internally or through an external pin Vpp. The gate and drain voltages are critical. Read and Program can be done in byte or word format by repeating the organization 8 or 16 times. Erase operation (logic '1') removes the charge deposited on the floating gate during Program (say, logic '0'). Two erasing schemes are generally used; one shown in FIG. 1*c*-3 utilizes source erase. Here, a large voltage (>Vcc) is applied to the source, and the gate may be grounded or kept at low voltage. Another scheme involves applying sufficient negative voltage to the control gate and modest positive voltage to the source (this is not shown in FIG. 1*c*). The channel erase is not shown as a separate figure. A NAND architecture is shown in FIG. 1(*d*). Here, the select transistors are in series with the nonvolatile memory.

FIG. 2 shows the cross-sectional schematic of a conventional floating trap nonvolatile memory in SONOS [Si (15), oxide (11), nitride (18), oxide (13), poly-Si (not shown under gate metal 14 for simplicity)] configuration. Here the charge in the gate is trapped at the interface between nitride, $Si_3N_4$, (18) and gate insulator (11) $SiO_2$. The $Si_3N_4$ layer has another oxide layer (13) on top of it. The thicknesses of layer (13) and (11) may be different in floating gate and floating trap devices.

These structures have also been fabricated with back gate arrangement in silicon-on-insulator (SOI) technology [A. Kumar and S. Tiwari, IEEE Trans. Nanotechnology, p. 247 December 2002].

FIG. 3(*a*) A conventional floating quantum dot gate nonvolatile memory with Si nanocrystals (20) as the floating gate (27) layer deposited on $SiO_2$ insulator layer (11) on top of the channel region. On top of nanocrystals (20) another insulator layer (19) is deposited. The control gate is shown as layer (14).

This structure was reported by Tiwari, et al. 1996]. The nanocrystal floating gate is obtained by depositing a thin layer of poly-Si on tunneling oxide in the gate region. This is followed by processing which leads to formation of nanocrystals forming islands as a process of self-organization.

FIG. 3(*b*) shows a nanocrystal (20) floating gate (27) memory with strained Si layer (21) transport channel using SiGe layers (22) in turn grown on p-type Si substrate (15). Here, the source and drain regions are shown in lightly-doped drain (LDD) configuration with lightly doped source n⁻ (23) and n⁻ drain (24) adjacent to heavily doped (n⁺) source (16) and drain (17). Strained Si layer (21) serves as the transport channel with higher mobility resulting in faster memory devices.

Hasannen et al.; [2004] reported this structure. Here, the main focus is on increasing the mobility of the carriers in the strained Si layer which is grown on SiGe layer. The tensile strained Si is known to manifest higher carrier mobility. As a result we can improve the access time etc for the memory.

FIG. 4. Cross-sectional schematic of a floating gate nonvolatile memory showing details of the cladded quantum dot layers. This FET structure is shown with symmetric lightly-doped drain (LDD) and source extensions. The floating gate is comprised of an array of cladded quantum dots, shown as two layers, which are sandwiched between gate insulator #1 (11) and the gate insulator #2 (19). Quantum dots consists of $SiO_x$ cladded [~1-2 nm cladding thickness with cladding layer shown as (31)] Si nanoparticles [3-6 nm diameter, shown as (30)]. Unlike the conventional floating gate Si nanocrystal memory, where the dots are invariably organized by depositing a thin poly-Si film on an insulator such as $SiO_2$ (and the phase separation leads to the formation of Si nanocrystal dots which are of different size and located randomly), here the quantum dots are of nearly uniformly-sized $SiO_x$-coated Si nanocrystals and are self-assembled. The cladded $SiO_x$—Si nanocrystal dots, shown as two layers (28 and 29), are sandwiched between gate insulator #1 (11) and the gate insulator #2 [(32) which is similar to layer (13) shown in FIG. 1]. One of these insulators (layer 11) interfaces with the transport channel (21), while the other dielectric [gate insulator 2 (32)] is in between the gate (14) and the cladded quantum dot layers (28, 29) forming collectively the floating gate (27). For example, a thin $SiO_2$ layer on Si could serve as the gate insulator #1 (11). Finally, a poly-Si or SiGe gate semiconductor (140), providing the desired work function and flat band voltage $V_{FB}$ is deposited over it with an Ohmic gate contact (14). Alternatively, a metal gate could be deposited depending on the threshold voltage $V_{TH}$, channel length L, and scaling laws defining the FET structure. $SiO_x$-Si cladded quantum dots form the floating gate (27).

One embodiment of floating quantum dot gate nonvolatile memory is having symmetric source and drain construction and comprising of $SiO_x$-cladded (~1-2 nm cladding thickness) Si nanoparticles (3-6 nm diameter).

In one embodiment of this invention the quantum dots are of nearly uniformly-sized $SiO_x$-coated Si nanocrystals and are placed closed to each other via the site-specific self-assembly (SSA) technique, reported by Jain and Papadimitrakopoulos [2006], on p-type transport channel region forming two or more layers depending on the conditions of deposition. More layers may also be deposited. The cladded $SiO_x$—Si nanocrystal dots, shown as two layers, are sandwiched between gate insulator #1 and the gate insulator #2. One of these insulators (insulator 1) interfaces with the transport channel, while the other dielectric (gate insulator 2) is in between the gate and the cladded quantum dots. For example, a thin $SiO_2$ layer on Si could serve as the gate insulator #1.

Alternately, a high-κ insulator (hafnium aluminum oxide, $Si_3N_4$) or lattice-matched (L-M) wide energy gap semiconductor layer such as ZnMgS or ZnMgBeSe or ZnMgBeSSe or other combinations (providing sufficient energy barriers for charge carriers in the channel) can be used and the $SiO_x$—Si cladded quantum dots could be assembled or deposited on this layer. A second thin layer of insulator, serving as the control dielectric layer, could be deposited on the cladded dots. The thickness of $SiO_x$ cladding layer on Si nanocrystals or quantum dots determines the separation between dots. Finally, a poly-Si or SiGe gate semiconductor or metal gate could be deposited depending on the channel length and scaling laws defining the FET structure. $SiO_x$—Si cladded quantum dots form the floating gate.

In practice these dots serve both as floating gate as well as floating trap memory gate. The charges are trapped at the interface of $SiO_x$ cladding and Si core of these cladded dots. This is a novel feature of these cladded quantum dot based devices. The magnitude of the net trapped charges in the floating dots determines the state of the memory. This is in contrast to the conventional floating trap [poly Si-oxide-nitride-oxide (SONOS) where SiN-Oxide interfaces host traps] and floating gate structures. The characteristic of SONOS traps is quite different than the traps or states at the $SiO_x$—Si quantum dot interfaces.

The dots are monodispersed and are placed using a site-specific self-assembly technique. Alternatively, they can be deposited by other methods including layer-by-layer assembly (J. Lee et al [2001]). Our approach using the cladded nanocrystal dots solves the problem of retention as well as fluctuation in device characteristics due to dot size variation, their placement, and inter-dot separation uncertainty.

Fabrication methodology, which can accomplish device fabrication in a manner compatible with current Si integrated circuit processing, is also described briefly in later sections. The channel may have p-pockets or halos on drain or source side to enhance CHE generation for Writing or Programming.

Lightly-doped sheath (LDS) around the n+ source and drain regions can also be used. In addition, asymmetric LDS FET structure is also envisioned. Asymmetric LDS devices where source and drain sheaths are not identical, provide a way to charge QDs near source and drain end at different voltages. This is needed in multiple bit writing circuits discussed in later sections of this invention. Other FET structures such as FINFETs or double gate FETs can be configured as QD-gate nonvolatile memory devices.

Figure 5:
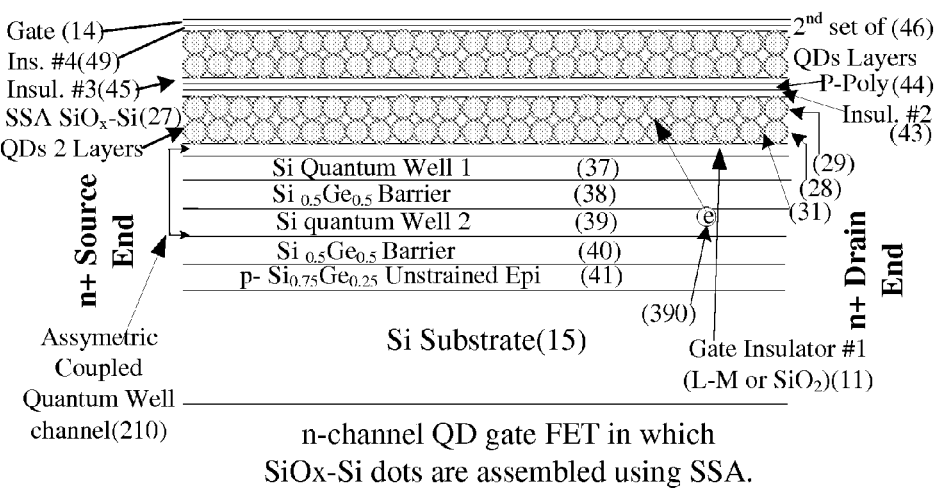
FIG. 5 shows a cross-sectional schematic of a nonvolatile memory with asymmetric coupled well transport channel having strained Si wells and SiGe barrier layer realized on Si substrate layer.

The asymmetric coupled quantum well design of FIG. 5 is such that electrons flow in the lower quantum well #2 (39). This enhances the retention time of the memory by increasing the 'effective' separation between inversion channel (hosting electron charge layer (located in the lower well) and the nanodots without increasing the 'progra' voltage for a given gate insulator layer and its thickness. FIG. 5 shows various layers forming the asymmetric coupled-quantum well serving as carrier transport channel. It comprises a Si Well #1 (37) which is below the gate insulator $SiO_2$ #1 (layer 11), SiGe barrier layer (38, separating the two quantum wells), Si Well #2 (39), and SiGe barrier (40), and unstrained SiGe layer (41) which is grown on p-Si substrate (15). There may be various combinations of these and other materials to accomplish this coupled-well structure.

The transport channel layers can be realized in silicon-on-insulator (SOI) configuration using partially depleted or fully depleted FET channel design configuration. In addition, other structural arrangements are reported in the literature to realize strain in the transport channel. The details of the memory device with QD gate (27) and coupled well channel (210) are also shown in FIG. 5 with out explicitly showing the source and drain regions (as shown in FIG. 4). The asymmetric coupled well (transport channel) memory structure in conjunction with the incorporation of cladded $SiO_x$—Si dot in the floating gate solves two challenging problems facing nanocrystal nonvolatile or flash memories: (a) charge retention and (b) fluctuation of program-erase characteristics.

Figure 6:
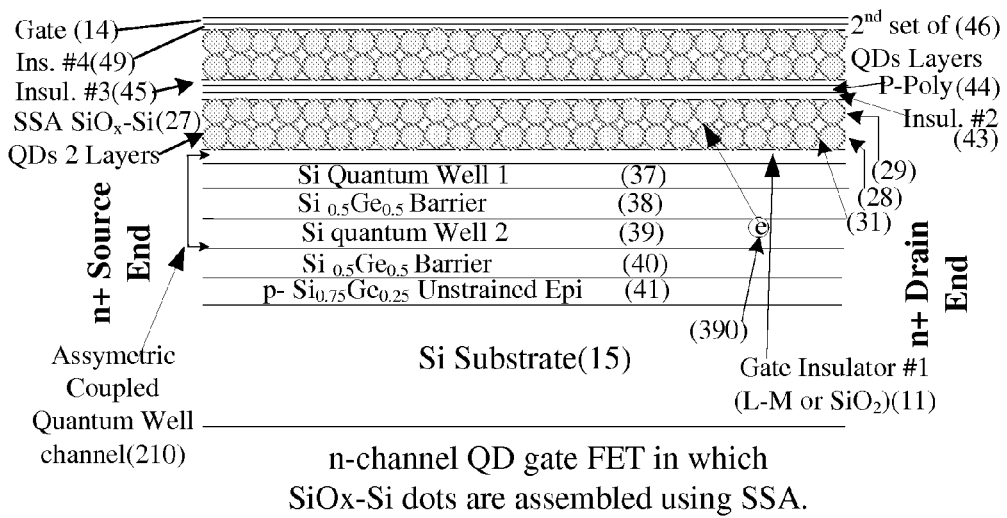
FIG. 6 shows two sets of quantum dot layers, gate insulator #1, insulator layers 2, p-semiconductor and insulator #3. Here, p-Si or semiconductor layer is inserted to self-assemble second set of quantum dots ($SiO_x$—Si quantum dots) using site-specific self-assembly (SSA) technique.

FIG. 6 describes a quantum dot gate nonvolatile memory where two sets of $SiO_x$—Si nanocrystal dots are assembled on lattice-matched high-energy gap semiconductor such as ZnMgS. Here, two sets [set #1 (27), and set #2 (46) of $SiO_x$-cladded Si quantum dot (each consisting of two layers (28 and 29 in set 1) and (47 and 48 in set #2)] are shown. These sets of 2-layer QDs are separated by a thin insulator (43). Layer 46 ($2^{nd}$ set of quantum dots) has another insulator #4 (layer 49) which has a metal gate (14) on top of it (depending on the FET design). In addition in some QD deposition methods, a thin p-semiconductor layer (44) is needed. For example, this is done in site-specific self-assembly, SSA, technique (which requires p-semiconductor to assemble site-specific layers if the space charge in the substrate is not adequate). This thin semiconductor layer may not be needed in alternate processing methodology for the $2^{nd}$ set of QDs.

A variation of FIG. 6 is where the second set (46) of QD layers are deposited on the gate insulator 2 (43) without having p-poly semiconductor (44) and insulator #3 (45). This structure is possible by layer-by-layer self-assembly or even by site-specific self-assembly (where the depletion charge density in the p-substrate is adequate). The structure of FIG. 5c2 is shown with poly-Si (or SiGe or Ge) gate (140) with a contact layer (14).

FIG. 7(a) describes the cross-sectional structure of a three-state FET, comprising of at least two layers of cladded quantum dots, reported by Jain [2008]. Unlike nonvolatile memory, there is no intentional dielectric layer between the gate and the cladded Si dots. Or the insulator is thin enough to provide path to trapped charge carriers localized on the dots to have access to the gate. These FET structures result in novel multi-state current-voltage (I-V) characteristics.

FIG. 7(a) describes a three-state Si FET comprising of at least two layers (28 and 29) of $SiO_x$-cladded (31) Si (30) quantum dots deposited on thin gate insulator layer (11) which is on top of the transport channel (21) formed between source (n⁻ extension 23, and n⁺ region 16) and drain (n⁻ extension 24, and n⁺ region 17) regions. The thin insulator layer (11) serving as a barrier layer. Unlike nonvolatile memory structure of FIG. 4(a), there is no intentional insulator layer#2 (19) between the gate (14) and the two layers comprising of $SiO_x$-cladded Si dots (27 representing 2 layers of cladded dots). The combination of thickness of thin insulator layer (11), $SiO_x$ cladding (~1-2 nm) around Si dots, Si dot sizes (~4-6 nm), and having at least two layers of cladded dots is critical to the manifestation of the 3-state behavior (shown in FIG. 7b). Increasing the thickness of insulator #1 (11) above a certain value will reduce the range of intermediate state 'i' in the transfer characteristics. These QD-gate FET structures exhibit novel 3-state current-voltage transfer characteristics (FIG. 7b). FIG. 7(b) shows experimental 3-state transfer characteristics along with optimized 3-state behavior (dashed line) of a QD-gate FET. The characteristics of the intermediate state can be optimized by adjusting the cladding and core thicknesses, the thickness of the insulator layer under the cladded dots, as well as the parameters of the transport channel and associated electrical behavior including threshold voltage of the FET structure.

FIG. 7(b) shows the transfer characteristic which show three distinct stable states:

(1) OFF state or "0" below threshold,
(2) Intermediate "i" or Low-Current Saturation State which is manifested over a range of gate voltage, and
(3) ON state or "1" "High-Current" Saturation State that exists above a certain value of $V_G$. Of these, "0" and "1" are common to conventional FETs.

In FIG. 7(b), solid line shows the experimental behavior and the dashed line illustrates the optimized behavior with design changes.

FIG. 8(a). Three-transistor nonvolatile random access memory (NVRAM) using a QD-gate nonvolatile device T3/QDM3 (81). Here, T3 (81) is the FET which comprises cladded quantum dots as the floating gate. This gate serves as the storage medium for the storage of charge which is transferred during the Programming or Writing of "1". The other two transistors T1 (82) and T2 (83) are access transistors.

A memory cell is selected by a word line pair 84-1 and 84-2 (which selects a particular Row), and a bit line pair 85-1 and 85-2 (which selects a Column). The matrix addressing scheme is same as described in standard textbooks [Sharma 2003].

When we want to Write '1' or Program '1' a Quantum Dot gate Memory device QDM3/T3 (81), we first select the desired cell by enabling the corresponding pair of Word lines (84-1 and 84-2) which turn ON transistors T1 (82) and T2 (83). Now Bit line (85-1) provides a pulse of $V_g$ to the gate of T3 (81) and Bit Line (85-2) provides a pulse of $V_d$ to the drain of T3 (81). The duration of these pulses is determined by the cladded quantum dot dimensions and other device parameters [including the thickness of insulator#1 (11) and insulator #2 (19/32) in FIG. 8b]. For writing '1' both $V_g$ and $V_d$ are high and their duration is such as to transfer adequate charge to the floating cladded quantum dots in the gate region. This accumulated charge on the floating quantum dot layers (27, in FIG. 8b) increases the threshold voltage (from $V_{TH1NV}$ to $V_{TH2NV}$) of the quantum dot FET serving as nonvolatile QD memory (QDM).

For Reading, $V_g$ is set to a voltage between the two thresholds ($V_{TH1NV}$ corresponding to '0' and $V_{TH2NV}$ corresponding to '1'), and if the stored value is '0', a current is sensed on the bit line (85-2); if the stored value is '1', there is not current at the Bit line (85-2).

Erasing [or writing '0'] is achieved by applying a $V_g$ pulse greater in magnitude than the $V_{TH2}$ and $V_d$ pulse with much greater magnitude than $V_g$. This will pull charges from the dots located in the floating gate region to the channel, and collected via the Bit line (85-2). This will reduce the threshold voltage to $V_{TH1NV}$.

The driver circuits are little more complex than conventional 1-transistor/1-capacitor DRAMs. In addition, Data out is in the form of current which can be converted to voltage levels in the sense amplifier circuits [Sharma, 2003 and other references cited here].

In another embodiment, transistor T1 (82) may be removed, and we have T3/QDM3 (81) and T2 (83) between a pair (two) of bit lines (85-1) and (85-2). However, there is only one Word line (84-2) in this configuration. So this is a 1-transistor T2 [conventional FET (83)]—and one QD FET T3 (81) (replacing a conventional capacitor used in DRAMs). This is 1-T/1-QDT DRAM cell which does not require refreshing. Note QD-FET is equivalent to QDT or QDM3.

For a conventional 3-T (3-Transistor) device used in DRAMs, reference is made to S-M. Kang and Y. Leblebici [2003].

FIG. 8b shows a nonvolatile QD gate memory with asymmetric source and drain extensions (see also FIG. 1b). This structure is similar to FIG. 4. Only the details which are not covered in FIG. 4 are described here.

Lightly doped drain (LDD) extension (2400) and source extension (2300) may be having different lengths and doping concentrations. In addition, p-type halos (like FIG. 1b) may be different in dimensions and doping concentrations. For example, the source side halo is (1701) and the drain side is (1702). Lightly doped sheaths (LDS) around the source and drain could also be employed [Jain 1990 (patent), Jain 2008].

Asymmetric extensions along with halo doping provide a way to design erasing characteristics. That is, this structure and its variations can be used for erasing operation where the retrieval of charge from the Quantum dots is easier from one end of the channel.

In addition, source/drain design along with halo doping can assist in Writing multiple-bits (i.e. hot electrons can be transferred to QD floating gate layers) at a different voltage in cladded dots at different spatial locations.

FIG. 9a shows the schematic cross-section of a self-aligned MOS gate MODFET incorporating QD gate to realize a nonvolatile memory. Jain et al. [1991, 1993] reported conventional MOS-gate MODFETs. These structures are adapted and configured incorporating at least one cladded quantum dot layer above the supply layer and below the gate contact devices by changes shown in this figure.

A nonvolatile memory device, comprising: a modulation doped field-effect transistor (MODFET) structure with a source (16), a drain (17), a gate region and a semiconductor substrate (15) in which a transport channel (210) is formed between said source and the drain and controlled by the voltage applied to said gate region; wherein the gate region has a multilayer structure. A spacer layer (1100) comprised from a lattice-matched or pseudomorphic wide energy gap semiconductor. An n-doped (including delta-doped) layer (1101) serving as the supply layer (supplying electrons to the transport channel under appropriate conditions). The supply layer has adequate doping of donor impurities providing electrons to the transport channel. A p-type semiconductor layer (1 102) selected from a group of semiconductors next to the second donor-doped supply layer (1101) comprising of acceptor type impurities. The function of this layer to facilitate site-specific self-assembly of $SiO_x$-cladded Si quantum dots (27) [see reference Jain and Papadimitrakopoulos, 2006]. This layer may be optional in case other assembly techniques are used for the deposition of cladded quantum dots.

Cladded quantum dots are selected from the group comprising of $SiO_x$-cladded Si nanocrystal quantum dots, $GeO_x$-cladded Ge nanocrystal quantum dots, and ZnSe coated ZnCdSe dots.

The layer (27) comprising of cladded quantum dots having at least one layer and preferably two [(28) and (29)] or more cladded nanocrystal layers. Deposited on top of cladded quantum dot layer (27) is an insulator layer (3200). Finally, a gate contact layer is deposited. This may have a semiconductor layer (140) followed by a metal Ohmic contact layer (14) or there may be one metal layer (14). Here, the source and drain contacts are not shown like FIG. 4 for Source (16) and Drain (17) regions.

FIG. 9(b) shows schematically the cross-section of a self-aligned MOS-gate SiGe MODFET incorporating two sets of cladded $SiO_x$—Si quantum dots. This structure may be used for multi-bit nonvolatile memory.

Here, a layer of insulator (3200) is deposited over first set (27) of cladded quantum dots. This is followed by the deposition of a p-type layer (3201) for site-specific self-assembly [this layer is not needed if the dots are deposited by other methods]. An insulator layer #3 (3202) is deposite. Now a second set of cladded quantum dots (46) having at least one and preferably two or more cladded nanocrystal layers is deposited. This is followed by another, a third insulator layer deposited over said second set of cladded quantum dots. A thin insulator layer (3203) comprising of $SiO_2$, $Si_3N_4$, SiON is deposited over the second set of quantum dots. Finally, a gate contact identified as 140/14 is deposited. Here, (140) refers to poly-Si or semiconductor layer for desired work function, and (14) refers to metal layer serving as work function deciding layer or Ohmic contact layer for poly-Si (140).

The first and second set of cladded quantum dots forms the floating quantum dot gate for the MOS-gate MODFET device. The amount of charge trapped in said floating gate, thereby rendering said modulation doped field-effect transistor to serve as a non-volatile memory device storing multiple of bits in the form of charges in various sets and layers of cladded nanocrystal quantum dots.

FIG. 10 Schematic cross-section of a self-aligned MOS gate MODFET incorporating QD gate to realize a 3-state device. This device is similar in construction to FIG. 9(*a*). The difference being that there is no insulator #2 layer above a set of quantum dots (27). Unlike the nonvolatile structure of FIG. 9(*a*) where one layer or more layers of cladded quantum dots are adequate for functioning as a nonvolatile memory, here we need two layers of quantum dots. There is restriction on the cladding layer thickness as well as core diameters. The cladding SiOx for the Si dots is about 1-2 nm and the dot diameter is 3-6 nm for SiOx-Si dots. In MODFETs it is essential that channel hot electrons (CHE) are transferred to the two layers of the cladded quantum dots (27) across the spacer layer (1100) and the supply layer (1101) as well as the p-semiconductor layer (1102). Although $SiO_x$—Si dots are shown, $GeO_x$—Ge and other semiconductor shell-core dots may be used. The semiconductor gate layer (140) and gate metal (14) are similar. The asymmetric SiGe—Si coupled well channel (210) and source and drain ends are same. Here, we have not shown n⁻ source and drain extensions Schematic cross-section of a self-aligned InGaAs—InP MODFET incorporating QD-gate to realize a nonvolatile memory device. This device is similar in construction of FIG. 10 with the difference that the substrate material is InP (15-1) and quantum well and barrier layers are InGaAs and InAlAs layers respectively. Similarly the spacer layer (1100-1) is compatible ZnSeTe or ZnBeMgSeTe layer lattice matched to InGaAs well and InAlAs barrier layers forming the coupled well transport channel (210-1). The transport channel is grown on p-InAlAs barrier (40-1) and p-InGaAs epi (41-1) layers. The upper well #1 is InGaAs (37-1) and the lower well #2 is (39-1). The wells are separated by the InAlAs barrier (38-1). Above the spacer layer (1100-1) is the n-type InAlAs (or other barrier material) supply layer (1107-1). The supply layer could be delta doped. On top of it is deposited a p-type semiconductor (1102-1) layer (such as InGaAs or other material) that will facilitate site-specific self-assembly of at least one layer or more layers of cladded $SiO_x$—Si or GeOx-Ge dots (27). The layer (1102-1) is not needed in case dots are deposited by other than site-specific self assembly [Jain and Papadimitrakopoulos, 2006]. Deposited on top of cladded dots (27) is an insulator layer (3200). This layer may be selected form a list of $SiO_2$, SiON, $Si_3N_4$ etc.
Nonvolatile memory with two layers of cladded dots can also be realized.

FIG. 12 shows a three-dimensional [FIGS. 12(*a*)] and a cross-sectiional schematic (12*b*) of a QD-gate 3-state MODFET. One difference between the structure of FIGS. 11 and 12 is the absence of insulator layer (3200) on top of the cladded quantum dots. In addition, unlike the nonvolatile memory, here we have two layers of cladded quatnum dots. As mentioned before, in a 3-state QD gate FETs, the thicknesses of spacer layer (1100-1), SiOx cladding thickness (1-2 nm), and the core diameter of dots (3-6 nm) need to be quite specific in order to obtain the intermediate state. FIG. 12(*a*) is the three dimensional view. The details are shown in FIG. 12(*b*).

FIG. 12(*b*) Cross-sectional schematic of a 3-state bistable MODFET with QD-Gate. Schematic cross-section of a self-aligned InGaAs—InP MODFET incorporating QD-gate to realize a nonvolatile device. This device is also similar in construction of FIG. 10 with the difference that the substrate material is InP and quantum well and barrier layers are InGaAs and InAlAs layers respectively. Here the spacer layer (1100-1) is lattice matched to InP and it is a wide energy semiconductor such as ZnSeTe, ZnBeMgSeTe, and n-type supply layer (1107-1) is made of InAlAs or other compatible material. The transport channel is grown on p-InAlAs barrier (40-1) and p-InGaAs epi (41-1) layers. The upper well #1 is InGaAs (37-1) and the lower well #2 is (39-1). The wells are separated by the InAlAs barrier (38-1). Above the spacer layer (1100-1) is the n-type InAlAs (or other barrier material) supply layer (1107-1). The supply layer could be delta doped. On top of it is deposited a p-type semiconductor (1102-1) layer (such as InGaAs or other material) that will facilitate site-specific self-assembly of at least one layer or more layers of cladded $SiO_x$—Si or GeOx-Ge dots (27).

The source end is (16-1) and the drain end is (17-1) and the gate material for work function purposes could be 140 with metal contact 14. Here, the MODFET can be configured in the self-aligned gate/source and drain configuration like the SiGe device of FIG. 10.

FIG. 13*a*. A static RAM (SRAM) cell with 3-state QD-gate FETs replacing conventional transistors for 3-state memory operation. Here, a conventional SRAM cell [Sharma, 2003; Cappelletti et al. 1999] is modified to have three states ('0', '1', and 'i') instead of two ('0', and '1') states. Here, the two N-MOS FETs are replaced by n-channel 3-state QD FETs (1300, 1301). The two load elements (1302 and 1303) may be selected from resistors, n-channel depletion MOSFET, n-channel enhancement type FETs. In this figure load elements are two depletion MOS transistors.

The other circuit elements are similar to conventional SRAMs. These include the bit lines (850-1, 850-2), word line (840), and access/pass transistors (1304, 1305).

FIG. 13*b*. CMOS-based static RAM (SRAM) cell incorporating two 3-state QD-gate n-FETs replacing conventional n-MOS transistors for 3-state memory operation. Here the load elements are replaced by two conventional p-MOS transistors (1306, 1307). This circuit structure will provide 3-state memory operation. The memory cell is accessed by the corresponding word line (840), which selects a Row, and turns ON the two access/pass transistors (1304) and (1305). Data is written in the cell by driving desired data and its complement to the two Bit lines (850-1, 850-2). When the access transistors are turned OFF, the data remains in the cell as High, Low, and Intermediate state. This circuit requires three voltage levels (0, VDD and ~VDD/2).

FIG. 13*c* shows a CMOS configuration, where a 4-state memory operation is feasible if pMOS transistors are replaced by 3-state QD-p-channel FETs (1308, 1309). The operation is similar to that of FIG. 13*b*, with the difference that 4-memory states can be achieved by adjusting the range of voltage of the intermediate state in n- and p-type QD-FETs.

FIG. 14 shows an embodiment of vertical FETs which can be configured as nonvolatile QD gate memory or a 3-state device (when there is no insulator layer over the cladded Quantum dots on the gate contact side). Here, cladded QDs are incorporated in the gate over the thin gate insulator layer. The QD can be self-assembled in a site-specific manner or in a layer-by-layer format.

For n-FETs, the starting Si layer (1400) is p-doped and is grown over an insulator (1399) such as ZnMgS or ZnMgBeS [which was deposited on Si substrate (1398) in a Si-on-Insulator (SOI) configuration]. Three layers are now grown: (i) 3-10 nm lattice-matched high-energy gap semiconductor serving as an insulator layer (1401), (ii) gate semiconductor such as SiGe or Ge (1402), and (iii) a lattice matched insulator layer (1403). The thickness of lattice-matched or pseudomorphic SiGe/Ge layer (1402) determines the length 'L' of the FET channel. This is followed by etching a window in these three layers. The exposed region is treated with preferential SiGe or Ge etches to open a pocket 4-10 nm in length (1404) in layer (1402). Now this is followed by deposition of a thin (2-4 nm) lattice-matched insulator layer (1405) in this pocket. Use of site-specific self-assembly for $SiO_x$-cladded Si dots will deposit 2 or more layers of cladded $SiO_x$—Si quantum dots (1406). Another layer (1407) of lattice matched insulator will pave the way for the final deposition of Si. Before Si deposition, a narrow window (1408) is etched in insulators (1405) and (1407) above the p-Si region (1400). Heavily doped n+-Si layer (1409) is deposited in the window region 1408. This is followed by deposition of n-Si (1410) thick enough to reach beyond the start of SiGe/Ge layer (1402). This overlap ensures connectivity of the transport channel/inversion layer with the n-Si (1409) serving as the source or drain region (as the case may be per circuit considerations). Now a layer of p-Si (1411) is deposited again to a thickness which ensures gate overlap with the n-Si (1412) serving as the drain region. That is, the deposition of n-Si (1412) follows the deposition of p-Si (1411). The transport channel is formed by applying appropriate voltages at the surface of p-Si (1411) under the SiGe/Ge gate (1402). This is followed by formation of an $n^+$ region (1413). Ohmic contacts can be formed in the two $n^+$ Si regions (1409, 1413) to realize the source and drain contact. Etching in the predetermined region will expose the surface of the SiGe/Ge layer (1402) for the formation of the gate contact (not shown here). The vertical FET shown here has double sided QD gates. Variation of this process will enable formation of p-channel VFETs.

The device of FIG. 14 can be configured as a 3-state FET or a nonvolatile memory. The advantage of this process is to realize channel length as permissible by the design rules. We envision forming 8 nm FETs and QD-FETs.

Additional Details:

Three-State MODFETs: Theoretical Background

The effect of carrier tunneling on output ($I_{DS}$-$V_{DS}$) and transfer characteristics ($I_{DS}$-$V_G$) of 3-state QD gate FETs is explained by Jain et al. [2007] in terms of variations in threshold voltage as a function of charge on the quantum dot layers [QD layer #1 (28) such as in FIG. 8b] which is near the quantum well channel; and QD layer #2 (29) near the gate electrode]. As the gate voltage $V_g$ is increased for a given drain to source voltage ($V_{DS}$), the charge from the channel tunnels to QD layers. This changes the net oxide charge in the gate insulator. The gate insulator comprises of an insulator layer $t_1$ (FIG. 7a) and two layers of $SiO_x$—Si nanocomposite dots. This in turn changes the threshold voltage.

Using standard equations available in standard MOS textbooks [Yang 1978], we can write threshold voltage as:

$$V_{TH} = V_{FB} + \frac{1}{C_o}qN_A\sqrt{\frac{2\varepsilon_{sr}\varepsilon_o(2\psi_B + V_x)}{qN_A}} + 2\psi_B, \quad (1)$$

$$V_{FB} = \varphi_{ms} - \frac{Q_{ox}}{C_{ox}}, \psi_B = \frac{kT}{q}\ln\frac{N_A}{n_i},$$

Change in threshold voltage $V_{TH}$ depends on surface potential $V_x$ in the channel, difference in metal work function difference $\phi_{ms}$, and oxide charge $Q_{ox}$, and oxide capacitance $C_o$ for a given doping $N_A$ in p-Si. The charge distribution $\rho(x)$ in the QD gate is not located at the $SiO_2$—Si boundary as is $Q_{ox}$ assumed in Equation (1). It is distributed and can be expressed by Yang [1978]. In the case of quantum dot layers, the charge is composed of discrete values represented by summation, and conventionally distributed or interface charge $Q_{ox}$ (not shown in Eq.2)

$$\Delta V_{FB} = \Delta V_{TH} = \quad (2)$$
$$-\frac{q}{C_o}\int_0^{x_g}\frac{x\rho(x)}{x_g}dx = -\frac{q}{C_o}\left[\sum\frac{x_{QD1}N_{QD1}}{x_g} + \sum\frac{x_{QD2}N_{QD2}}{x_g}\right]$$

Here, $x_g$ is the gate insulator thickness. The charge density in a quantum dot layer can be expressed as $q\rho(x)=qnN_{QD}$, where $N_{QD}$ is the number of dots per unit area under the gate, and n is the number of positive charges per dot at the $SiO_x$—Si nanocrystal boundary.

The value of $nN_{QD}$ depends on the tunneling probability. As a result, threshold voltage will change as the charge on the quantum dot layers changes due to tunneling from the transport channel. There is an inherent equilibrium charge density on the $SiO_x$—Si dots (similar to any $SiO_2$—Si or high-κ Si interface). This charge value is decreased as electrons tunnel to allowed states in QDs (changing $qnN_{QD}$ value by neutralizing some of the positive interface charge). That is, net charge (Eq. 2) on the gate insulator (including QD layers) decreases, and this means the change $\Delta V_{FB}$ or $\Delta V_{TH}$ is less negative. Therefore, $V_{TH}$ magnitude increases. This results in reduced drain current as can be seen from a very simplistic $I_D$-$V_{DS}$ equation, and results in "low-current saturation" or intermediate state "i" [FIG. 7b].

$$I_D = \left(\frac{W}{L}\right)C_o\mu_n\left[(V_G - V_{TH})V_{DS} - \frac{V_{DS}^2}{2}\right] \quad (3)$$

In the case of MOS-gate MODFETs, the threshold voltage expressions are different [Jain 1993]. The expression reported in this reference needs to be modified with the incorporation of cladded SiOx-Si quantum dots.

Similarly, the threshold expression will be modified for Quantum dot gate nonvolatile memory using MODFETs. Hasaneen el al. [24] has reported a model for conventional QD gate nonvolatile memory using BSIMv3 level #49 [Chen et al.]. These models need to be modified and adapted for cladded QD layers forming the gate in a MOS-gate MODFET.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Cited References

F. Jain, Site-specific Nanoparticle Self-Assembly, U.S. application Ser. No. 12/006,974, Jan. 9, 2008.

A. Sharma, Advanced Semiconductor Memories, IEEE Press, Publisher John Wiley, 2003.

S. Tiwari, F. Rana, K. Chan, H, Hanafi, W. Chan and D. Buchanan, "Volatile and non-volatile memories in silicon with nano-crystal storage," IEDM, pp. 521-525, Dec. 1995.

S. Tiwari, et al., "A silicon nanocrystals based memory," Appl. Phys. Lett., 68 (10), 1377, 1996

E-S. Hasaneen, E. Heller, R. Bansal, W. Huang, and F. Jain, Solid State Electronics, Vol. 48, p. 2055, 2004

M. L. Ostraat, J. W. De Blauwe, M. L. Green, L. D. Bell, M. L. Brongersma, J. Casperson, R. C. Flagan, and H. A. Atwater, "Synthesis characterization of aerosol silicon nanocrystal nonvolatile floating-gate memory devices", Applied Physics Letters, Vol. 79, pp. 433-435, July 2001

P. Cappelletti et al, Flash Memories, Kluwer Press 1999

W. Brown and J. Brewer, Nonvolatile Semiconductor Memory Technology, IEEE Press, 1998

P. Cappelletti et al, Flash Memories, Kluwer Press 1999.

W. Brown and J. Brewer, Nonvolatile Semiconductor Memory Technology, IEEE Press, 1998.

A. Kumar and S. Tiwari, IEEE Trans. Nanotechnology, p.247 December 2002

F. Jain and F. Papadimitrakopoulos, Site-specific Nanoparticle Self-Assembly, U.S. application Ser. No. 11/454,963, Jun. 15, 2006.

Jeunghoon Lee, Mathew Mathai, Faquir Jain' and Fotios Papadimitrakopoulos, "Layer-By-Layer Growth of CdSe based Nanocrystal Light-Emitting Diodes", J. Nanoscience, Vol #1, pp. 59-64, March 2001

N. Kouklin, S. Bandyopadhyay, S. Tereshin, A. Varfolomeev, and Zaretsky, "Electronic bistability in electrochemically self-assembled quantum dots: A potential nonvolatile random access memory", Applied Physics Letters, Vol. 76, pp. 460-462, Jan. 2000.

F. Jain and E. Heller, "Coupled Well Field-Effect Transistors" U.S. Pat. No. 6,498,360, Dec. 24, 2002;

E. Heller, S. Islam, G. Zhao, F. Jain, "Analysis of $In_{0.52}Al_{0.48}As/In_{0.53}Ga_{0.47}As/InP$ quantum wire MODFETs employing coupled well channels," Solid-State Electronics 1999; 43: 901-914.

S-M. Kang and Y. Leblebici, McGraw Hill, CMOS digital integrated circuits, 2003

E. S. Yang, Fundamentals of Semiconductor Devices, McGraw Hill, New York, N.Y., 1978.

Y. Taur and T. Ning, Fundamentals of Modern VLSI Devices, Cambridge University Press, Cambridge, England, 1998.

F. Jain, "Improved LDD-FET Structures with Lightly Doped n– Sheaths Around the n+ Source/Drain Regions", filed with the U.S. Pat. No. 4,949,136, Aug. 14, 1990.

Bin Yu, L. Chang, S. Ahmed, H. Wang, S. Bell, C. Yang, C. Tabery, C. Ho, Q. Xiang, T-J. King, J. Bokor, C. Hu, M-R. Lin, and D. Kyser, "FinFET Scaling to 10 nm Gate Length," IEDM Tech. Digest, p. 251, Dec. 2002.

C. H. Huang, D. S. Yu, A. Chin, C. H. Wu, W. J. Chen, C. Zhu, M. F. Li, B. J. Cho, and D. Kwong, "Fully Silicided NiSi and Germanided NiGe Dual Gates on SiO2/Si and Al2O3/Ge-On-Insulator MOSFETs", IEDM Digest 2003, 2003.

S. Takagi, T. Mizuno, T. Tezuka, N. Sugiyama, T. Numata, K.Usuda, Y. Moriyama, S. Nakaharai, J. Koga, A. Tanabe, N. Hirashita and T. Maeda, "Channel Structure Design, Fabrication and Carrier Transport Properties of Strained-Si/SiGe-On-Insulator (Strained-SOI) MOSFETs", IEDM Digest 2003.

F. Jain and F. Papadimitrakopoulos, U.S. Pat. No. 6,992,317 B2, Jan. 31, 2006.

J. Lee, X. Wang, W. Bai, N. Lu, and D.-L. Kwong, "Theoretical and experimental investigation of Si nanocrystal memory device with $HfO_2$ high-k tunneling dielectric," IEEE Trans. Elec. Dev., vol. 50, pp. 2067-2072, October 2003.

F. Capasso et. al. (Chapter 7) in Physics of Quantum Electron Devices, Springer Verlag, 1990.

G. Yusa and H. Sakaki, Appl. Phys. Lett. 70, 345-347 (1997).

A. Rack, R. Wetzler, A. Wacker and E. Scholl, Proc. of 26$^{th}$ Int. Conf. on Phys. of Semi., ICPS-16, 2002;

A. F. Gonzalez, P. Mazumder, Multiple-valued signed digit adder using negative differential resistance devices, IEEE Trans. on Computers 47, 9, (1998), 947-959.

B. Radanovic, M. Syrzycki, Current-mode CMOS adders using multiple-valued logic Canadian Conference on Electrical and Computer Engineering, (1996), 190-193;

O. Ishizuka, D. Handoko, VLSI design of a quaternary multiplier with direct generation of partial products, Proc. 27th Int. Symp. Multiple-Valued Logic, (1997), 169-174;

T. Okuda, T. Murotani, A four-level storage 4 Gb DRAM IEEE Journal of Solid-State Circuits 32, 11, (1997), 1743-1747.

S. Norsworthy, R. Schreifer, G. Temes, "Delta-Sigma Data Conveters", IEEE Press, 1997;

Michael P. Flynn, Conor Donovan and Linda Sattler, "Digital calibration incorporating redundancy of flash ADCs", IEEE transactions on circuit and systems-II, vol. 50, No. 5, pp. 205-213, May 2003;

Hui Liu and Marwan Hassoun, "A 9-b 40-Msamples Reconfigurable pipeline analog-to-digital converter", IEEE transactions on circuit and systems-II, vol. 49, No. 7, pp.449-456, July 2002;

Shang-Yuan Chuang and Terry L. Sculley, "A Digitally self-calibrating 14-bit 10-MHz CMOS pipelined A/D converter", IEEE Journal of solid-state circuits, vol. 37, No. 6, pp. 674-683, June 2002;

R. Velampati and F. C. Jain, A Novel Nonvolatile Memory Using SiOx-Cladded Si Quantum Dots, NSTI Nanotech, Santa Clara, Calif., May 20-24 2007.

F. Jain, M. Gokhale, S. K. Islam, and C. L. Chung, "Analysis of Self-Aligned MOSFETs with Modulation-Doped SiGe Channels", Solid-State Electronics, 36 pp.1613-1618, November 1993].

F. Jain, S. Islam, M. Gokhale and C. Chung, "Self-aligned heterostructure MOSFEts using modulation doped strained layers on Si—Ge on Si substrates, Am. Phys. Soc., 16-18 March 1991 Meeting (Poster Session), Cincinnati, Ohio.

S-M. Kang and Y. Leblebici, McGraw Hill, CMOS digital integrated circuits, 2003.

F. Jain et al, Proc. of ISDRS Conf., December 11-14, 2007 (U. Maryland, College Park, Md.).

I claim:

1. A nonvolatile memory device, comprising:
a modulation doped field-effect transistor (MODFET) structure having a source,
a drain,
a gate region and
a semiconductor substrate in which a transport channel is formed between the source and the drain, wherein the transport channel is controlled by a voltage applied to the gate region, wherein the gate region includes a multilayer structure having:
a first layer located proximate to the transport channel, wherein the transport channel is constructed from at least one material selected from the group consisting of an insulator and a wide energy gap lattice matched semiconductor and a pseudomorphic semiconductor layer, wherein the first layer serves as a spacer layer, a second layer located proximate to the first layer, wherein the second layer is constructed from a doped semiconductor material having donor impurities that provide electrons as a supply layer to the transport channel, a third layer located proximate to the second layer wherein the third layer includes a semiconductor layer having acceptor type impurities, and a first set of cladded quantum dots assembled on the third layer, wherein the first set of cladded quantum dots is selected from a group consisting of $SiO_x$-cladded Si nanocrystal quantum dots and $GeO_x$-cladded Ge nanocrystal quantum dots, wherein the first set of cladded quantum dots include at least one cladded nanocrystal layers, a first insulator layer deposited over the first set of cladded quantum dots, wherein the first insulator layer is deposited with a fourth layer to facilitate deposition of cladded quantum dots, wherein the fourth layer is deposited with a second insulator layer, a second set of cladded quantum dots having at least one cladded nanocrystal layers deposited over the second insulator layer, a third insulator layer deposited over the second set of cladded quantum dots, and the first and second set of cladded quantum dots configured to form a floating quantum dot gate and a control gate electrode over the third insulator layer.

2. The nonvolatile memory device of claim 1,
wherein the semiconductor substrate includes at least one of Si and silicon-on-insulator (SOI),
wherein the gate region has a multilayer structure having:
the first layer located proximate to the transport channel and including at least one of an insulator, a wide energy gap lattice-matched semiconductor and a pseudomorphic semiconductor layer,
a second layer next to the first layer, wherein the second layer is constructed from a semiconductor material having donor impurities that provide electrons as the supply layer to the transport channel,
a third layer located proximate to the second layer, wherein the third layer includes a semiconductor material having acceptor type impurities, wherein a first set of cladded nanocrystal quantum dots is assembled on the third layer, the first set of cladded nanocrystal quantum dots being one selected from a group consisting of $SiO_x$-cladded Si nanocrystal quantum dots, and $GeO_x$-cladded-Ge nanocrystal quantum dots,
wherein the first set of $SiO_x$-cladded Si nanocrystal quantum dots includes at least one cladded nanocrystal layers, a first insulator layer including at least one of $SiO_2$ and SiON, and high-k oxides deposited over the first set of cladded nanocrystal quantum dots, wherein the first insulator layer is deposited with a fourth layer being one selected from a group consisting of p-poly Si, p-poly SiGe, and p-poly Ge, to facilitate deposition of a second set of $SiO_x$-cladded Si nanocrystal dots using site-specific self-assembly,
wherein the fourth layer is deposited with the second insulator layer, a second set of cladded dots and a third insulator layer, wherein the third insulator layer is one selected from the group consisting of $SiO_2$ and SiON, and high-k oxides, the second set of cladded dots is one selected from the group consisting of $SiO_x$-cladded Si nanocrystal dots and $GeO_x$-cladded-Ge nanocrystal quantum dots, wherein the second set of cladded quantum dots includes at least one cladded nanocrystal layer, and wherein the third insulator layer is one selected from the group consisting of $SiO_2$ and SiON, and wherein high-k oxides is deposited over the second set of cladded quantum dots, and the fourth insulator layer is deposited with gate material which includes at least one of a poly-Si, poly-SiGe, poly-Ge, and metal material, wherein the first set of cladded quantum dots and the second set of cladded quantum dots form a floating quantum dot gate.

3. The nonvolatile memory device of claim 2, wherein the transport channel is realized using couple quantum wells selected from symmetric or asymmetric construction using a Si and SiGe well barrier combination, and wherein the spacer layer is a lattice matched wide energy semiconductor selected from at least one of ZnMgS and ZnMgBeS, and the supply layer is selected from n-doped ZnS and n-doped Si.

4. The nonvolatile memory device of claim 1, wherein the semiconductor substrate is InP and the transport channel is realized using coupled quantum wells selected from at least one of a symmetric or asymmetric construction using InGaAs and InAlAs well and barrier combinations, and wherein the spacer layer is formed and is selected from a wide energy semiconductor material being one selected from the group consisting of InAlAs, ZnSeTe, ZnBeMgSeTe, and the supply layer is being one selected from the group consisting of n-doped InAlAs, and n-InGaAsP, and wherein the cladded quantum dots are selected from the group consisting of $SiO_x$-cladded Si nanocrystal dots $GeO_x$-cladded-Ge nanocrystal quantum dot, and pseudomorphic semiconductor cladded dots.

5. The nonvolatile memory device as described in claim 1 which is used as a nonvolatile random access memory device, further comprising a nonvolatile QD gate MOSFET device, comprising:
a gate and a drain, wherein the gate and the drain are connected to a pair of bit lines via a first field-effect transistor and a second field-effect transistor, wherein the pair of bit lines include a bit line 1 and a bit line 2 which are complementary, wherein the gate is connected to the first field-effect transistor via its a source terminal, the source is connected to a ground, the gate of the first field-effect transistor is connected to bit line 1 the drain of the first field-effect transistor is connected to a word line, the drain of the quantum dot gate field-effect transistor is connected to the drain of the second field-effect transistor, and the gate of the second field-effect transistor is connected to bit line 2, and the source of the second field-effect transistor is connected to an output, wherein the gates of the first and second field-effect transistors are configured as at least one of a MOSFET and a MODFET structure, the gate further comprising one or more sets of cladded quantum dots, wherein the cladded quantum dots are one selected from the group consisting of $SiO_x$ cladded-Si core, $GeO_x$-cladded-Ge core, and pseudomorphic ZnSe cladding-ZnCdSe core.

6. The nonvolatile memory device as described in claim 5, wherein the nonvolatile memory device is used as a random access memory and the QD-gate nonvolatile device is realized in Si substrate or Si-on-insulator substrate (SOI).

7. The nonvolatile memory device as described in claim 5, wherein the nonvolatile memory is used as a random access memory and the QD-gate nonvolatile device is realized in substrate selected from the group consisting of GaAs, InP, Ge, ZnSe, wherein the quantum dot are assembled on at least one of insulator and wide energy gap semiconductor layers selected from the list consisting of ZnMgS, ZnS, ZnBeMgSeTe, ZnSeTe, InGaP.

8. The nonvolatile memory device of claim 1, wherein semiconductor substrate is a p-type semiconductor material.

9. The nonvolatile memory device of claim 1, wherein the semiconductor substrate is a p-type semiconductor material and the fourth layer is constructed from at least one of a p-poly Si, p-poly Ge, p-poly SiGe, p-amorphous Si and p-amorphous Ge material.

10. A nonvolatile memory device, comprising:
  a modulation doped field-effect transistor (MOM-ET) structure with a source,
  a drain,
  a gate region and
  a p-type semiconductor substrate in which a transport channel is formed between the source and the drain and controllable by a voltage applied to the gate region, wherein the gate region has a multilayer structure having:
    a first layer next to the transport channel, the first layer being selected from a group consisting of an insulator and a wide energy gap lattice matched semiconductor, and a pseudomorphic semiconductor layer,
    wherein a set of individually cladded quantum dots is assembled on the first insulator layer, the set of cladded quantum dots being selected from a group consisting of $SiO_x$-cladded Si nanocrystal quantum dots, and $GeO_x$-cladded Ge nanocrystal quantum dots,
    wherein each Si nanocrystal quantum dot is deposited by SiOx thin layer, and each Ge nanocrystal quantum dot is deposited with GeOx layer, wherein the SiOx and GeOx layers serve as the cladding layer,
    wherein the set of cladded quantum dots includes at least one layer of cladded nanocrystal layers, and wherein the cladded quantum dots have cores that provide modulation doping,
  a first insulator layer deposited over the set of cladded quantum dots, wherein the set of cladded quantum dots form a floating quantum dot gate and a control gate electrode over the first insulator layer.

* * * * *